US011502218B2

(12) United States Patent
Kim et al.

(10) Patent No.: US 11,502,218 B2
(45) Date of Patent: Nov. 15, 2022

(54) DISPLAY DEVICE AND METHOD OF FABRICATING THE SAME

(71) Applicant: SAMSUNG ELECTRONICS CO., LTD., Suwon-si (KR)

(72) Inventors: Nakhyun Kim, Yongin-si (KR); Junhee Choi, Seongnam-si (KR); Kiho Kong, Suwon-si (KR); Deukseok Chung, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 169 days.

(21) Appl. No.: 16/871,214

(22) Filed: May 11, 2020

(65) Prior Publication Data

US 2021/0126154 A1 Apr. 29, 2021

(30) Foreign Application Priority Data

Oct. 23, 2019 (KR) ........................ 10-2019-0132388

(51) Int. Cl.

*H01L 33/00* (2010.01)
*H01L 27/15* (2006.01)
*H01L 33/50* (2010.01)

(52) U.S. Cl.

CPC .......... *H01L 33/005* (2013.01); *H01L 27/156* (2013.01); *H01L 33/502* (2013.01);
(Continued)

(58) Field of Classification Search

CPC ... H01L 33/005; H01L 27/156; H01L 33/502; H01L 2933/0041; H01L 2933/0058;
(Continued)

(56) References Cited

U.S. PATENT DOCUMENTS

| | | | |
|---|---|---|---|
| 8,044,575 | B2 | 10/2011 | Kawamura |
| 2005/0084775 | A1 | 4/2005 | Kawaguchi et al. |

(Continued)

FOREIGN PATENT DOCUMENTS

| | | | |
|---|---|---|---|
| EP | 3 223 313 | A1 | 9/2017 |
| JP | 2010-33905 | A | 2/2010 |

(Continued)

OTHER PUBLICATIONS

Communication dated Mar. 19, 2021, issued by the European Patent Office in counterpart European Application No. 20200444.6.

(Continued)

*Primary Examiner* — Jonathan Han
(74) *Attorney, Agent, or Firm* — Sughrue Mion, PLLC

(57) ABSTRACT

A method of manufacturing a display device includes forming a first light-emitting area on a substrate, and forming a first color adjustment pattern on the first light-emitting area by emitting first light from the first light-emitting area, wherein the first light-emitting area includes a first semiconductor layer, a second semiconductor layer provided on the first semiconductor layer, a first active layer arranged between the first semiconductor layer and the second semiconductor layer, a first contact electrically connecting the substrate and the first semiconductor layer, and a first preliminary common electrode electrically connected to the second semiconductor layer.

32 Claims, 34 Drawing Sheets

(52) U.S. Cl.
CPC ................. *H01L 2933/0041* (2013.01); *H01L 2933/0058* (2013.01)

(58) Field of Classification Search
CPC ... H01L 33/507; H01L 33/0093; H01L 33/38; H01L 33/405; H01L 33/501; H01L 33/58; H01L 33/60; H01L 2933/0016; H01L 2933/0066; H01L 2933/0091; H01L 33/387; H01L 33/504; H01L 33/505; H01L 33/62; H01L 25/0753; H01L 33/44; H01L 33/46; H01L 21/76895; H01L 27/1218; H01L 27/124; H01L 27/1259; H01L 33/0045; H01L 33/50
See application file for complete search history.

(56) References Cited

U.S. PATENT DOCUMENTS

| | | | | |
|---|---|---|---|---|
| 2007/0105256 | A1 | 5/2007 | Fitzgerald | |
| 2007/0275624 | A1 | 11/2007 | Kawaguchi et al. | |
| 2015/0116985 | A1* | 4/2015 | Bang | G02F 1/00 156/247 |
| 2015/0255505 | A1* | 9/2015 | Jeoung | H05K 1/189 257/89 |
| 2016/0018094 | A1 | 1/2016 | Bower et al. | |
| 2016/0062179 | A1* | 3/2016 | Eguchi | G02F 1/13306 349/25 |
| 2016/0146904 | A1 | 5/2016 | Stetson, Jr. et al. | |
| 2017/0077190 | A1* | 3/2017 | Hashimoto | H01L 27/322 |
| 2017/0092820 | A1* | 3/2017 | Kim | H01L 25/0753 |
| 2017/0117506 | A1* | 4/2017 | Hiraoka | H01L 27/3276 |
| 2017/0309698 | A1 | 10/2017 | Bower et al. | |
| 2018/0217465 | A1* | 8/2018 | Nagata | G02F 1/133536 |
| 2018/0261790 | A1* | 9/2018 | Ichikawa | H01L 27/3209 |
| 2019/0115333 | A1 | 4/2019 | Wu et al. | |
| 2019/0273179 | A1* | 9/2019 | Iguchi | H01L 33/46 |
| 2020/0343230 | A1* | 10/2020 | Sizov | H01L 25/18 |

FOREIGN PATENT DOCUMENTS

| | | | |
|---|---|---|---|
| KR | 10-2007-0063438 | A | 6/2007 |
| WO | 2019/147589 | A1 | 8/2019 |

OTHER PUBLICATIONS

Pickering, S. et al., "Patterned mist deposition of tri-colour CdSe/ZnS quantum dot films toward RGB LED devices", OPTO-Electronics Review, 2012, vol. 20, No. 2, pp. 148-152.

* cited by examiner

DISPLAY DEVICE AND METHOD OF FABRICATING THE SAME

CROSS-REFERENCE TO RELATED APPLICATION(S)

This application is based on and claims priority from Korean Patent Application No. 10-2019-0132388, filed on Oct. 23, 2019, in the Korean Intellectual Property Office, the disclosure of which is incorporated herein in its entirety by reference.

BACKGROUND

1. Field

The disclosure relates to a display device and a method of manufacturing the display device.

2. Description of Related Art

Liquid crystal displays (LCDs) and organic light emitting diode (OLED) displays are widely used as display devices. Recently, technology for manufacturing a high-resolution display device using micro-light emitting diodes (micro-LEDs) has attracted attention. However, highly efficient and small LED chips are required to manufacture a high-resolution display device using micro-LEDs, and a high-level transfer technique is required to arrange small LED chips at appropriate positions.

SUMMARY

Provided are display devices with improved durability and methods of manufacturing the display devices.

Provided are method of manufacturing a display device that provides improved yield.

Additional aspects will be set forth in part in the description which follows and, in part, will be apparent from the description, or may be learned by practice of the presented embodiments of the disclosure.

According to an aspect of the disclosure, there is provided a method of manufacturing a display device, the method comprising: forming a first light-emitting area on a support substrate; and forming a first color adjustment pattern on the first light-emitting area by emitting first light from the first light-emitting area, wherein the forming of the first light-emitting area comprises: providing a first semiconductor layer; providing a second semiconductor layer on the first semiconductor layer; providing a first active layer between the first semiconductor layer and the second semiconductor layer; providing a first contact electrically connecting the support substrate and the first semiconductor layer; and providing a first preliminary common electrode electrically connected to the second semiconductor layer.

The forming of the first light-emitting area on the support substrate comprises: sequentially forming the second semiconductor layer, the first active layer, and the first semiconductor layer on a growth substrate; forming the first contact on the first semiconductor layer; forming the support substrate on the first contact; removing the growth substrate; and forming the first preliminary common electrode on a surface of the second semiconductor layer exposed by removing the growth substrate.

The support substrate may be directly bonded to the first contact.

The method may further comprise forming a bonding layer between the support substrate and the first contact, wherein the support substrate and the first contact are bonded to each other by the bonding layer.

The forming of the first color adjustment pattern may comprise: providing a first color adjustment material layer on the first active layer; curing a portion of the first color adjustment material layer by emitting the first light to the first color adjustment material layer; and removing an uncured portion of the first color adjustment material layer.

The method may further comprise providing a first light extraction pattern on an upper surface of the second semiconductor layer.

The forming of the first light-emitting area may further comprise forming a first preliminary driving transistor, wherein a source area of the first preliminary driving transistor is electrically connected to the first contact.

The method may further comprise forming a second light-emitting area on the support substrate; and forming a second color adjustment pattern on the second light-emitting area by emitting a second light from the second light-emitting area, wherein the forming of the second light-emitting area may comprise: providing a third semiconductor layer; providing a fourth semiconductor layer on the third semiconductor layer; providing a second active layer between the third semiconductor layer and the fourth semiconductor layer; providing a second contact electrically connecting the support substrate and the third semiconductor layer; and providing a second preliminary common electrode electrically connected to the fourth semiconductor layer, wherein the first light-emitting area and the second light-emitting area are spaced apart from each other along a first direction parallel with an upper surface of the support substrate.

The emitting of the first light may comprise: applying a first voltage to the first preliminary common electrode; applying a second voltage that is different from the first voltage to the second preliminary common electrode; and applying a ground voltage to the support substrate, wherein a magnitude of the first voltage is larger than a magnitude of the second voltage.

The emitting of the second light may comprise: applying a third voltage to the first preliminary common electrode; applying a fourth voltage that is different from the third voltage to the second preliminary common electrode; and applying the ground voltage to the support substrate, wherein a magnitude of the fourth voltage is larger than a magnitude of the third voltage.

The method may further comprise forming an isolation area between the first light-emitting area and the second light-emitting area, wherein the isolation area is formed by an ion injection process.

The forming of the second color adjustment pattern may comprise: providing a second color adjustment material layer on the second light-emitting area; curing a portion of the second color adjustment material layer by irradiating the second light to the second color adjustment material layer; and removing an uncured portion of the second color adjustment material layer.

The method may further comprise forming a light-absorbing partition wall between the first color adjustment pattern and the second color adjustment pattern.

The method may further comprise forming a first reflective film between the light-absorbing partition wall and the first color adjustment pattern; and forming a second reflective film between the light-absorbing partition wall and the second color adjustment pattern.

The method may further comprise forming a third reflective film on an upper surface of the light-absorbing partition wall.

The method may further comprise forming an insulating partition wall between the first color adjustment pattern and the second color adjustment pattern; forming a first reflective film between the insulating partition wall and the first color adjustment pattern; and forming a second reflective film between the insulating partition wall and the second color adjustment pattern, wherein the insulating partition wall has a light-transmitting property.

A width of the insulating partition wall may decrease in a second direction perpendicular to the upper surface of the support substrate, and wherein the width of the insulating partition wall may be a size of the insulating partition wall along the first direction.

A width of the insulating partition wall may be constant, and wherein the width of the insulating partition wall may be a size of the insulating partition wall along the first direction.

The method may further comprise forming a first color filter on the first color adjustment pattern; and forming a second color filter on the second color adjustment pattern, wherein the first color filter allows a first color light to pass through and the second color filter allows a second color light to pass through, the first color light being different from the second color light.

According to another aspect of the disclosure, there is provided a method of manufacturing a display device, the method comprising: forming a first semiconductor layer on a growth substrate; forming, on the first semiconductor layer, active patterns arranged along a first direction that is parallel to an upper surface of the first semiconductor layer; forming a second semiconductor layer on the active patterns, respectively; forming one or more contacts on the second semiconductor layer, respectively; bonding a support substrate onto the one or more contacts; removing the growth substrate; forming one or more preliminary common electrodes respectively corresponding to one or more of the active patterns on a side of the active patterns opposite to the second semiconductor layer; and forming color adjustment patterns respectively on the active patterns by emitting light from the active patterns.

The method may further comprise reducing a thickness of the first semiconductor layer by performing an etching process on the first semiconductor layer exposed by removing the growth substrate.

The method may further comprise patterning the first semiconductor layer to form light extraction patterns respectively on the active patterns.

The method may further comprise forming, in the preliminary common electrodes, openings that expose the first semiconductor layer, respectively.

The removing of the growth substrate may comprise performing a polishing process and a dry etching process on the growth substrate, wherein the growth substrate comprises silicon (Si).

The removing of the growth substrate may comprise performing a lift-off process on the growth substrate using laser, wherein the growth substrate comprises sapphire.

Among the color adjustment patterns, color adjustment patterns which emit light having different colors may be formed at different times.

According to another aspect of the disclosure, there is provided a method of manufacturing a display device, the method comprising: forming, on a substrate, a first contact, a second contact, and a third contact, which are arranged along a first direction that is parallel to an upper surface of the substrate; forming a first light-emitting pattern on the first contact, a second light-emitting pattern on the second contact, and a third light-emitting pattern on the third contact; forming a first preliminary common electrode on the first light-emitting pattern and a second preliminary common electrode on the second light-emitting pattern; forming a first color adjustment pattern on the first light-emitting pattern by emitting a first light from the first light-emitting pattern; and forming a second color adjustment pattern on the second light-emitting pattern by emitting a second light from the second light-emitting pattern, wherein each of the first light-emitting pattern, the second light-emitting pattern, and the third light-emitting pattern comprises a first semiconductor layer, a second semiconductor layer, and an active layer provided between the first and second semiconductor layers.

The forming of the first color adjustment pattern and the forming of the second color adjustment pattern may be performed at different times.

The method may further comprise forming an insulating pattern on the third light-emitting pattern; and forming reflective films respectively between the insulating pattern and the first color adjustment pattern and between the insulating pattern and the second color adjustment pattern, wherein the first color adjustment pattern, the second color adjustment pattern, and the insulating pattern are arranged in the first direction.

The method may further comprise forming an insulating film on the first color adjustment pattern, the second color adjustment pattern, the insulating pattern, and the reflective films, wherein the insulating film and the insulating pattern form a single structure.

The method may further comprise forming a dummy preliminary common electrode on the third light-emitting pattern, wherein a voltage is not applied to the dummy preliminary common electrode.

The method may further comprise forming a third preliminary common electrode on the third light-emitting pattern; and forming a third color adjustment pattern on the third light-emitting pattern by emitting a third light from the third light-emitting pattern.

The method may further comprise forming a conductive pad on the third preliminary common electrode; and forming a via electrically connecting the conductive pad and the third preliminary common electrode.

According to another aspect of the disclosure, there is provided a display device comprising: a first driving transistor, a second driving transistor, and a third driving transistor, which are provided on a substrate; a first light-emitting pattern, a second light-emitting pattern, and a third light-emitting pattern, each respectively corresponding to one of the first to third driving transistors; a first common electrode and a second common electrode, each respectively corresponding to one of the first and second light-emitting patterns; a first color adjustment pattern and a second color adjustment pattern, each respectively corresponding to one of the first and second common electrodes; and a first contact configured to electrically connect the first driving transistor to the first light-emitting pattern, a second contact configured to electrically connect the second driving transistor to the second light-emitting pattern, and a third contact configured to electrically connect the third driving transistor to the third light-emitting pattern, wherein the first to third light-emitting patterns are controlled by the first to third driving transistors, respectively, and wherein each of the first to third light-emitting patterns comprises a first semiconductor layer, a second semiconductor layer, and an active layer provided between the first and second semiconductor layers.

The display device may further comprise a first reflective electrode provided between the first light-emitting pattern and the first contact, a second reflective electrode provided between the second light-emitting pattern and the second contact, and a third reflective electrode provided between the third light-emitting pattern and the third contact, wherein the reflective electrodes reflect light which is generated in the active layer and emitted towards lower portions of the first to third light-emitting patterns.

The display device may further comprise a first light extraction pattern, a second light extraction pattern, and a third light extraction pattern, which are provided on the first light-emitting pattern, the second light-emitting pattern and the third light-emitting pattern, respectively.

Each of the first and second common electrodes may extend along a first direction that is parallel to an upper surface of the substrate, the first light-emitting pattern and the second light-emitting pattern overlap each other along a second direction perpendicular to the upper surface of the substrate, and the second light-emitting pattern and the second common electrode overlap each other along the second direction.

The first common electrode may have a first opening exposing the first light-emitting pattern, and the second common electrode may have a second opening exposing the second light-emitting pattern.

The display device may further comprise a dummy common electrode provided on the third light-emitting pattern, wherein the dummy common electrode is not electrically connected.

The display device may further comprise a third common electrode provided on the third light-emitting pattern; a third color adjustment pattern provided on the third common electrode; a conductive pad provided on the third common electrode; and a via electrically connecting the third common electrode and the conductive pad.

The first light-emitting pattern, the second light-emitting pattern, and the third light-emitting pattern may be provided on a first layer above the first to third driving transistors, the first common electrode and the second common electrode may be provided on a second layer above the first and second light-emitting patterns, and the first color adjustment pattern and the second color adjustment pattern may be provided on a third layer above the first and second common electrodes.

According to another aspect of the disclosure, there is provided a display device comprising: a support substrate; a first light-emitting area on the support substrate, the first light-emitting area comprising: a first semiconductor layer provided on the support substrate; an active layer provided on the first semiconductor layer; a second semiconductor layer provided on the active layer; a contact electrically connecting the support substrate and the first semiconductor layer; and a first preliminary common electrode provided on the second semiconductor layer, the first preliminary common electrode being configured to be electrically connected to the second semiconductor layer; and a first color adjustment pattern formed on the first light-emitting area.

BRIEF DESCRIPTION OF THE DRAWINGS

The above and other aspects, features, and advantages of certain example embodiments of the disclosure will be more apparent from the following description taken in conjunction with the accompanying drawings, in which:

FIGS. 3 to 10 and 12 to 20 are cross-sectional views for describing a method of manufacturing a display device according to example embodiments, and FIG. 11 is a plan view for describing a method of manufacturing a display device according to example embodiments;

DETAILED DESCRIPTION

Figure 1:
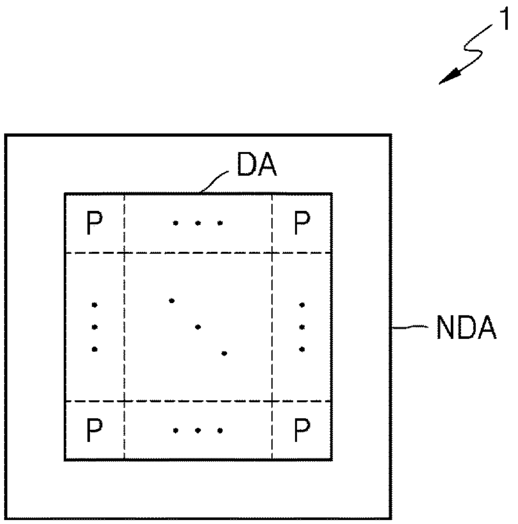
FIG. 1 is a conceptual diagram illustrating a display device according to example embodiments.

Reference will now be made in detail to embodiments, examples of which are illustrated in the accompanying drawings, wherein like reference numerals refer to like elements throughout. In this regard, the example embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments will be described in detail with reference to the accompanying drawings. In the drawings, like reference numerals refer to the like elements throughout, and sizes of elements may be exaggerated for clarity. The embodiments described below are merely examples and various modifications can be made thereto.

When an element is referred to as being "on" another element, it can be directly on the other element, or intervening elements may also be present.

The terms of a singular form may include plural forms unless otherwise specified. When it is mentioned that a certain part "includes" or "comprises" certain elements, the part may further include other elements, unless otherwise specified.

The term " . . . unit" or the like denotes a unit for processing at least one function or operation, and may be implemented as hardware or software or a combination thereof.

Figure 2:
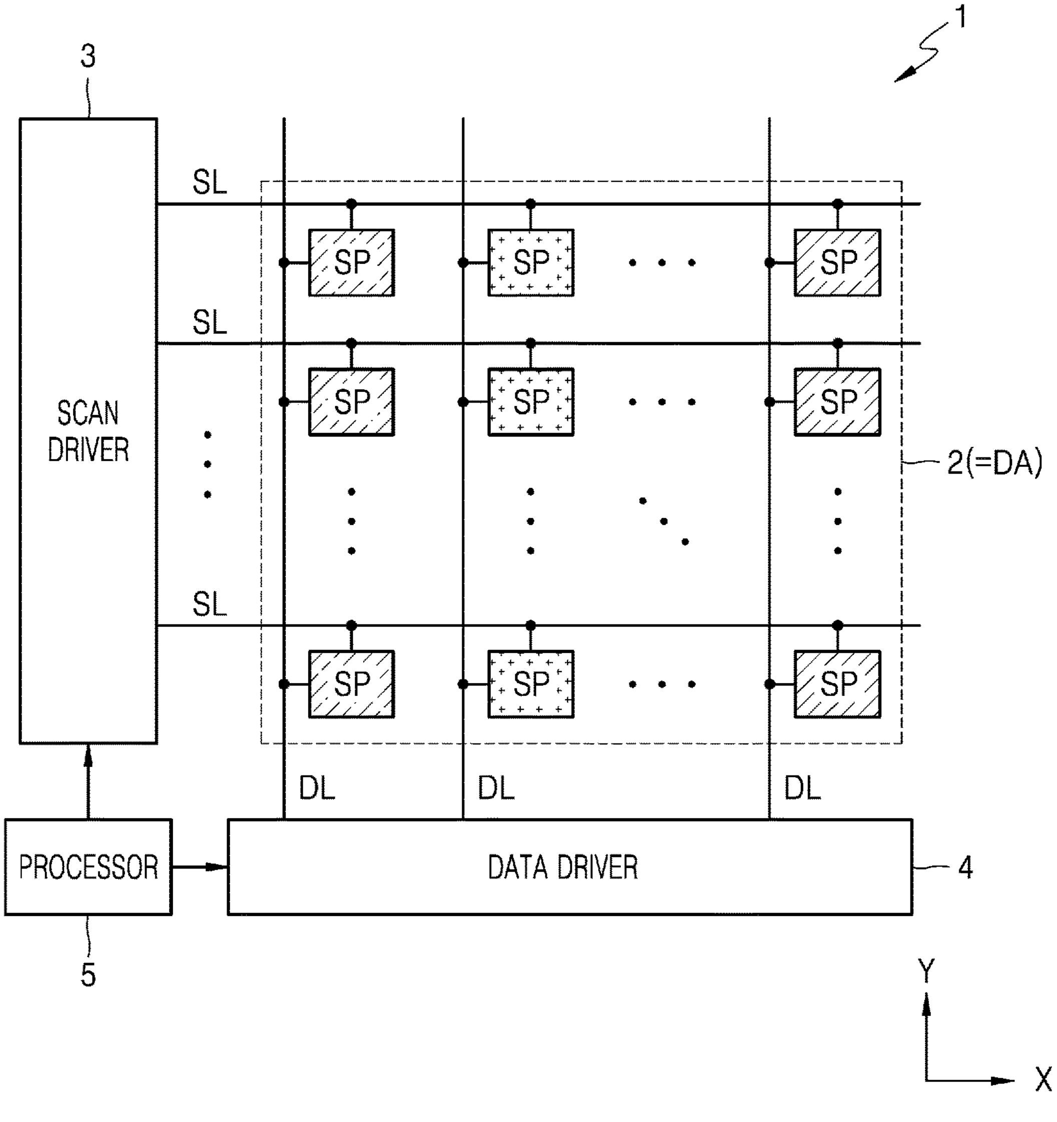
FIG. 2 is a circuit diagram illustrating a display device according to example embodiments.

FIG. 1 is a conceptual diagram illustrating a display device 1 according to example embodiments. FIG. 2 is a circuit diagram illustrating the display device 1 according to example embodiments.

Referring to FIGS. 1 and 2, the display device 1 may include a display area DA and a non-display area NDA. The display area DA, which is an area for displaying an image, may be referred to as a display portion. The display area DA may include pixels P for displaying an image. Each of the pixels P may include sub pixels SP to be described later, which emit different colors. Also, each of the sub pixels SP may include a driving transistor, a capacitor, and a light emitting area.

The display device 1 may include a display 2, a scan driver 3, a data driver 4, and a processor 5. According to an embodiment, the display 2 may be DA illustrated in FIG. 1. That is, the display 2 may be arranged in the display area DA of the display device 1, and the scan driver 3, the data driver 4, and the processor 5 may be arranged in the non-display area NDA of the display device 1.

The display 2 may include scan lines SL for transferring a scan signal, data lines DL for transferring a data signal in response to the scan signal from the scan lines SL, and sub pixels SP corresponding to the data lines DL and the scan lines SL. The scan lines SL and the data lines DL receive signals from the scan driver 3 and the data driver 4 arranged in the non-display area, and thus the scan lines SL and the data lines DL may extend to the non-display area NDA illustrated in FIG. 1.

FIG. 2 illustrates that the scan lines SL extend in a direction X and the data lines DL extend in a direction Y intersecting with the direction X, but an embodiment is not limited thereto. For example, extension directions of the data lines DL and the scan lines SL may be switched to each other.

FIGS. 3 to 20 illustrate a method of manufacturing a display device 11 according to example embodiments. For instance, FIGS. 3 to 10 and 12 to 20 are cross-sectional views for describing a method of manufacturing a display device 11 according to example embodiments. FIG. 11 is a plan view for describing a method of manufacturing a display device 11 according to example embodiments. Moreover, the viewpoint of FIGS. 3 to 6 is vertically opposite to the viewpoint of FIGS. 7 to 10 and 12 to 19. For convenience, a second direction of FIGS. 3 to 6 and a second direction of FIGS. 7 to 10 and 12 to 19 are defined to be opposite to each other.

Figure 3:
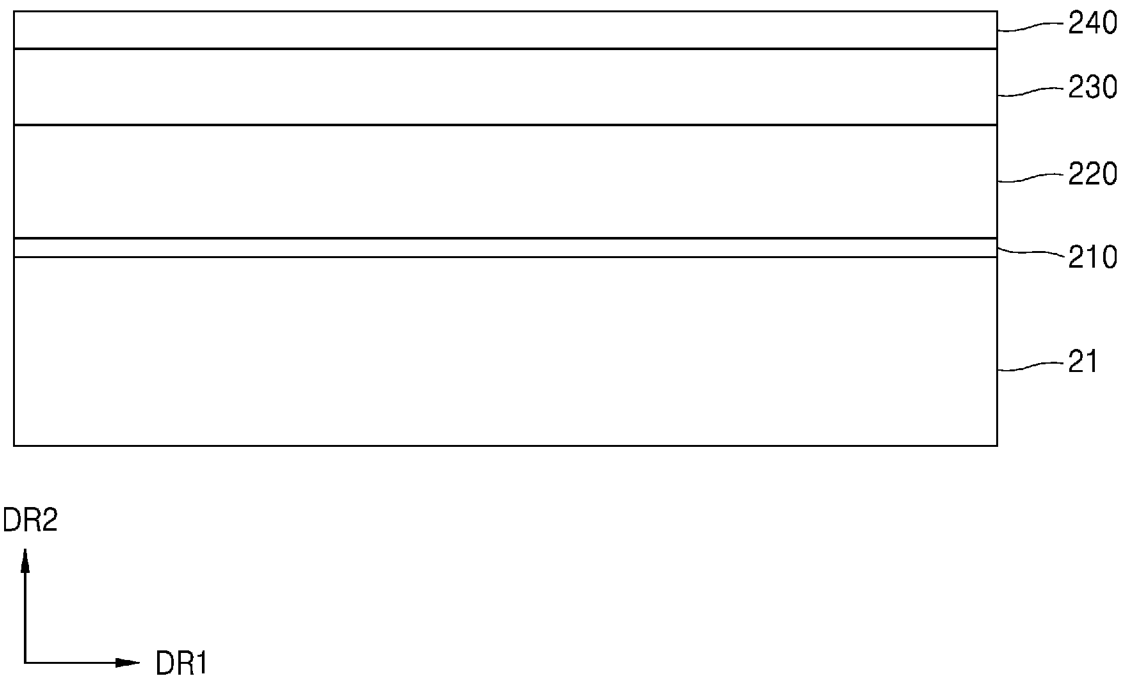
FIGS. 3 to 20 illustrate a method of manufacturing a display device 11 according to example embodiments. For instance.

Referring to FIG. 3, a first buffer layer 210 may be formed on a growth substrate 21 in a direction DR2. For example, the growth substrate 21 may be a mother substrate for growing the first semiconductor layer 220 and the growth substrate 21 may be a silicon (Si) substrate or a sapphire substrate.

Forming the first buffer layer 210 may include, for example, performing a chemical vapor deposition (CVD) process, a physical vapor deposition (PVD) process, or an atom layer deposition (ALD) process. The first buffer layer 210 may reduce a lattice constant difference between the growth substrate 21 and a first semiconductor layer 220 to be described later. For example, a lattice constant of the first buffer layer 210 may have a value between the lattice constant of the first semiconductor layer 220 and the lattice constant of the substrate 21. The first buffer layer 210 may include a Group III-V compound semiconductor having a first conductive type. For example, the first buffer layer 210 may include n-type GaN or n-type AlN/AlGaN.

The first semiconductor layer 220 may be formed on the first buffer layer 210. The forming of the first semiconductor layer 220 may include, for example, performing a CVD process, a PVD process, or an ALD process. The first semiconductor layer 220 may include a Group III-V compound semiconductor having a first conductive type. For example, the first semiconductor layer 220 may include n-type GaN.

According to an example embodiment, an active layer 230 may be formed on the first semiconductor layer 220. The forming of the active layer 230 may include, for example, performing a CVD process, a PVD process, or an ALD process. The active layer 230 may generate light by receiving electrons and holes provided from the first semiconductor layer 220 and a second semiconductor layer 240 to be described later. The active layer 230 may include a single quantum well (SQW), a multi quantum well (MQW), super lattices (SLs), or a combination thereof. For example, the active layer 230 may include $In_xGa_{1-x}N/GaN$ ($0 \le x < 1$).

According to an example embodiment, the second semiconductor layer 240 may be formed on the active layer 230. The forming of the second semiconductor layer 240 may include, for example, performing a CVD process, a PVD process, or an ALD process. The second semiconductor layer 240 may include a Group III-V compound semiconductor having a second conductive type that is different from the first conductive type. For example, the second semiconductor layer 240 may include p-type GaN.

Figure 4:
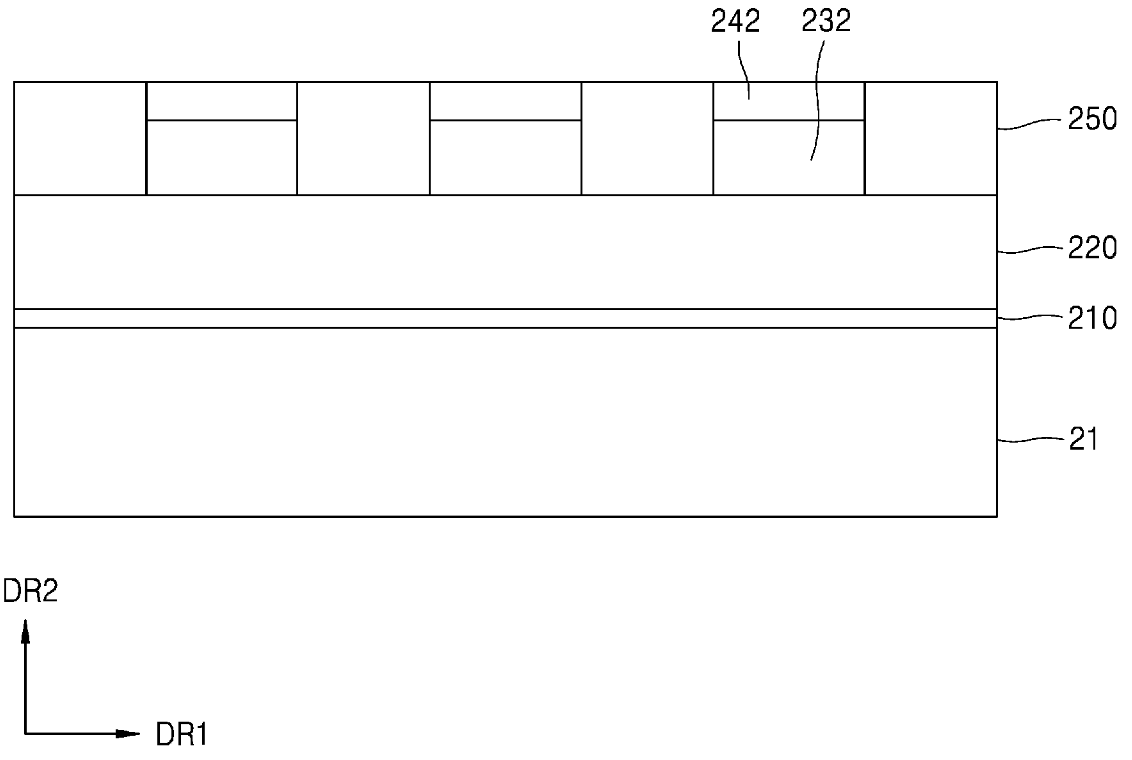

Referring to FIG. 4, isolation patterns 250 may be formed in the second semiconductor layer 240 and the active layer 230. The forming of the isolation patterns 250 may include injecting impurities into the second semiconductor layer 240 and the active layer 230 by performing an ion injection process. For example, the impurities may include an element argon (Ar). The isolation patterns 250 may have electrical insulating properties. The isolation patterns 250 may be arranged along a first direction DR1 that is parallel with an upper surface of the growth substrate 21. The isolation patterns 250 may define active patterns 232 and second semiconductor patterns 242. According to an example embodiment, the active pattern 232 and the second semiconductor pattern 242 which are immediately adjacent to each other may be sequentially stacked between the isolation patterns 250.

Figure 5:
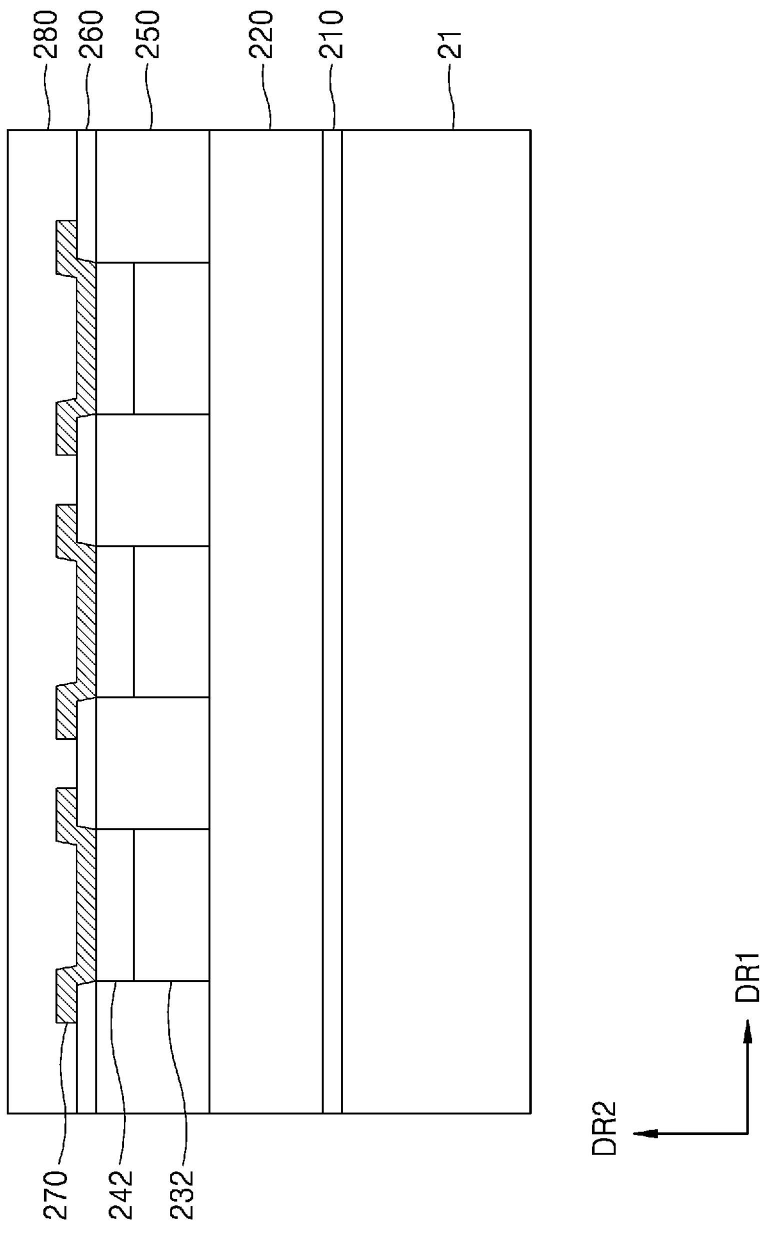

Referring to FIG. 5, passivation patterns 260 may be respectively formed on the isolation patterns 250. The forming of the passivation patterns 260 may include forming a passivation film that extends along surfaces of the second semiconductor patterns 242 and isolation patterns 250 and exposing the second semiconductor patterns 242 by patterning the passivation film. The forming of the passivation film may include, for example, performing a CVD process, a PVD process, or an ALD process. The passivation film may include an insulating material. For example, the passivation film may include $SiO_2$, $Al_2O_3$, SiN, AlN, or a combination thereof. The patterning the passivation film may include etching the passivation film using an etching mask provided on the passivation film. The etching mask may be removed during a process of etching the passivation film or after the etching process is ended.

Reflective electrodes 270 may be respectively formed on the second semiconductor patterns 242. The forming of the reflective electrodes 270 may include forming a reflective electrode film that extends along surfaces of the second semiconductor patterns 242 and passivation patterns 260 and exposing the passivation patterns 260 by patterning the reflective electrode film. The forming of the reflective electrode film may include, for example, performing a CVD process, a PVD process, or an ALD process. The reflective electrode film may reflect light. The reflective electrode film may include a p-type electrode material. For example, the reflective electrode film may include at least one of silver (Ag), aluminum (Al), indium (In), titanium (Ti), nickel (Ni), copper (Cu), chromium (Cr), gold (Au), palladium (Pd), tungsten (W), or platinum (Pt).

The patterning the reflective electrode film may include etching the reflective electrode film using an etching mask provided on the reflective electrode film. The etching mask may be removed during a process of etching the reflective electrode film or after the etching process is ended. End portions of the reflective electrodes 270 may be provided on the passivation patterns 260. End portions of the passivation patterns 260 may be provided between the end portions of the reflective electrodes 270 and the isolation patterns 250.

According to an example embodiment, a first insulating layer 280 may be formed on the reflective electrodes 270 and the passivation patterns 260. The forming of the first insulating layer 280 may include, for example, performing a CVD process, a PVD process, or an ALD process. The first insulating layer 280 may extend along the first direction DR1. The first insulating layer 280 may cover the reflective electrodes 270 and the passivation patterns 260. The first insulating layer 280 may include $SiO_2$, $Al_2O_3$, SiN, AlN, or a combination including one or more of $SiO_2$, $Al_2O_3$, SiN or AlN.

Figure 6:
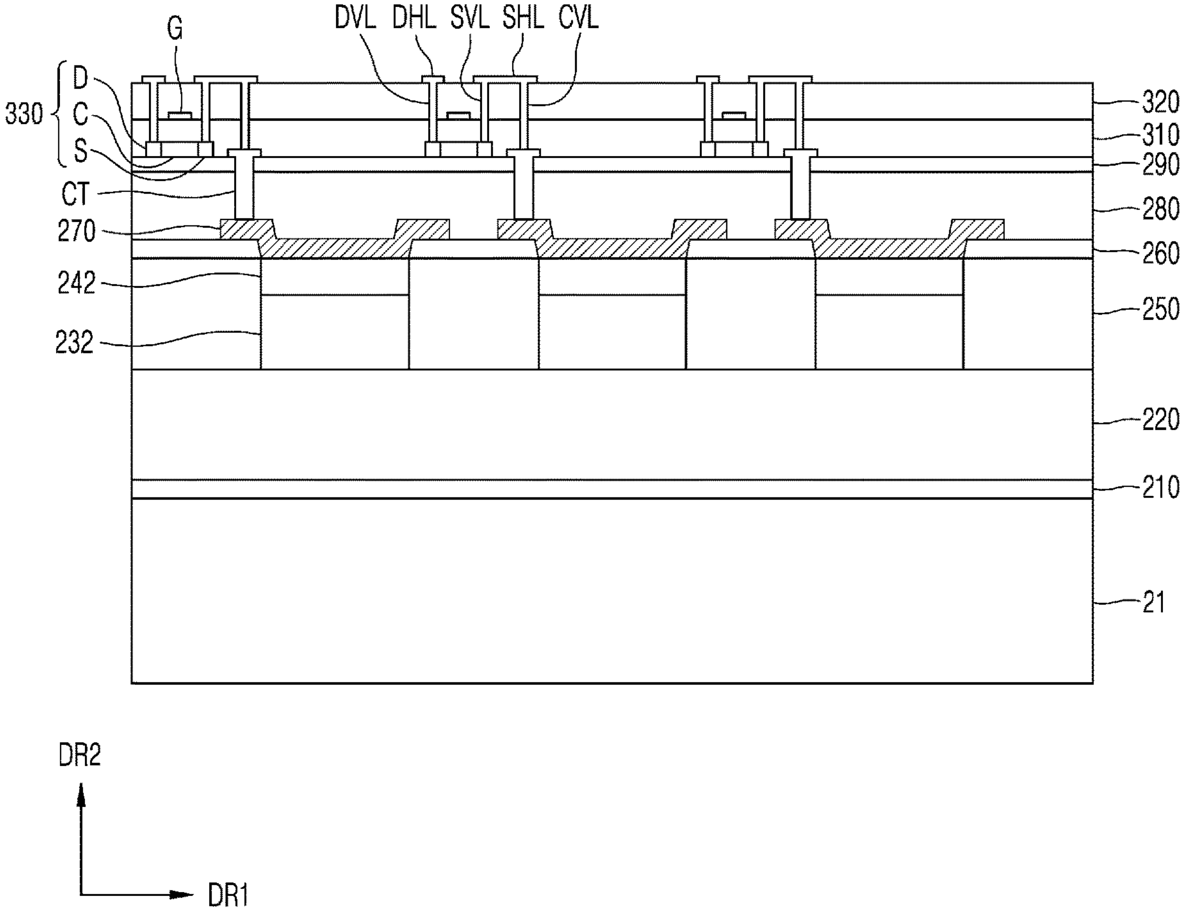

Referring to FIG. 6, a second buffer layer 290 may be formed on the first insulating layer 280. The forming of the second buffer layer 290 may include, for example, performing a CVD process, a PVD process, or an ALD process. The second buffer layer 290 may include an insulating material. For example, the buffer layer 290 may include $SiO_2$, $Al_2O_3$, SiN, AlN, or a combination including one or more of $SiO_2$, $Al_2O_3$, SiN or AlN.

According to an example embodiment, contacts CT penetrating the second buffer layer 290 and the first insulating layer 280 may be formed. The contacts CT may be electrically and respectively connected to the reflective electrodes 270. For example, the contacts CT may directly contact the reflective electrodes 270 respectively. The forming of the contacts CT may include forming openings that penetrate the second buffer layer 290 and the first insulating layer 280 to expose the reflective electrodes 270, and providing an electrically conductive material in the openings. Although the electrically conductive material provided in the openings is illustrated as fully filling the openings, this is merely an example. In another example, the electrically conductive material may extend along surfaces of the first insulating layer 280 and the second buffer layer 290 exposed by the openings, and may not fully fill the openings. Upper portions of the contacts CT may be exposed on the second buffer layer 290.

According to an example embodiment, semiconductor patterns 330 may be formed on the second buffer layer 290. Each of the semiconductor patterns 330 may include a source area S, a drain area D, and a channel area C. The forming of the semiconductor patterns 330 may include forming amorphous semiconductor patterns on the second buffer layer 290, and irradiating two end portions of each of the amorphous semiconductor patterns with laser to crystallize the two ends. For example, the amorphous semiconductor patterns may include amorphous silicon. The two crystallized end portions may be defined as the source area S and the drain area D respectively. A portion between the two end portions of the semiconductor patterns 330 may be amorphous. The amorphous portion may be defined as the channel area C. The semiconductor patterns 330 may be provided on the isolation patterns 250. In other words, the semiconductor patterns 330 may overlap along a second direction DR2 perpendicular to upper surfaces of the growth substrate 21 and the isolation patterns 250.

According to an example embodiment, a second insulating layer 310 may be formed on the semiconductor patterns 330, the second buffer layer 290, and the contacts CT. The forming of the second insulating layer 310 may include, for example, performing a CVD process, a PVD process, or an ALD process. The second insulating layer 310 may extend along the first direction DR1. The second insulating layer 310 may include $SiO_2$, $Al_2O_3$, SiN, AlN, or a combination including one or more of $SiO_2$, $Al_2O_3$, SiN or AlN.

According to an example embodiment, gate electrodes G may be formed on the second insulating layer 310. The forming of the gate electrodes G may include forming a gate electrode film that extends along the second insulating layer 310, and patterning the gate electrode film. The forming of the gate electrode film may include, for example, performing a CVD process, a PVD process, or an ALD process. The gate electrode film may include an electrically conductive material. According to an example embodiment, the electrically conductive material may be metal. The patterning the gate electrode film may include etching the gate electrode film using an etching mask provided on the gate electrode film. The etching mask may be removed during a process of etching the gate electrode film or after the etching process is ended. The gate electrodes G may be respectively provided over the channel areas C. The gate electrodes G may be provided on opposite sides to the channel areas C with respect to the second insulating layer 310. The gate electrodes G may overlap the channel areas C along the second direction DR2.

According to an example embodiment, a third insulating layer 320 may be formed on the gate electrodes G and the second insulating layer 310. The forming of the third insulating layer 320 may include, for example, performing a CVD process, a PVD process, or an ALD process. The third insulating layer 320 may extend along the first direction DR1. The third insulating layer 320 may include $SiO_2$, $Al_2O_3$, SiN, AlN, or a combination thereof.

According to an example embodiment, drain vertical lines DVL penetrating the second insulating layer 310 and the third insulating layer 320 may be formed. The drain vertical lines DVL may include an electrically conductive material. According to an example embodiment, the electrically conductive material may be metal. The forming of the drain vertical lines DVL may include forming openings that penetrate the second insulating layer 310 and the third insulating layer 320 to expose the drain areas D, and providing an electrically conductive material in the openings. Although the electrically conductive material provided in the openings is illustrated as fully filling the openings, this is merely an example. In another example, the electrically conductive material may extend along surfaces of the second insulating layer 310 and the third insulating layer 320 exposed by the openings, and may not fully fill the openings. The drain vertical lines DVL may be electrically and respectively connected to the drain areas D. For example, the drain vertical lines DVL may directly contact the drain areas D respectively.

According to an example embodiment, drain horizontal lines DHL may be formed on the drain vertical lines DVL respectively. The drain horizontal lines DHL may be formed together with the drain vertical lines DVL when the drain vertical lines DVL are formed. For example, when providing an electrically conductive material in openings for forming the drain vertical lines DVL, an electrically conductive material may be provided on an upper surface of the third insulating layer 320. The electrically conductive material provided on the upper surface of the third insulating layer 320 and directly contacting the drain vertical lines DVL may be defined as the drain horizontal lines DHL. The drain areas D may be electrically connected by the drain vertical lines DVL and the drain horizontal lines DHL to the data driver 4 (shown in FIG. 2) described with reference to FIGS. 1 and 2.

According to an example embodiment, source vertical lines SVL and contact vertical lines CVL penetrating the second insulating layer 310 and the third insulating layer 320 may be formed. The source vertical lines SVL and the contact vertical lines CVL may be formed together when the drain vertical lines DVL are formed. The source vertical lines SVL and the contact vertical lines CVL may include an electrically conductive material. According to an example embodiment, the electrically conductive material may be metal. The forming of the source vertical lines SVL and the contact vertical lines CVL may include forming openings that penetrate the second insulating layer 310 and the third insulating layer 320 to expose the source areas S and the contacts CT, and providing an electrically conductive material in the openings. Although the electrically conductive material provided in the openings is illustrated as fully filling the openings, this is merely an example. In another example, the electrically conductive material may extend along surfaces of the second insulating layer 310 and the third insulating layer 320 exposed by the openings, and may not fully fill the openings. The source vertical lines SVL may be electrically and respectively connected to the source areas S. For example, the source vertical lines SVL may directly contact the source areas S respectively. The contact vertical lines CVL may be electrically and respectively connected to the contacts CT. For example, the contact vertical lines CVL may directly contact the contacts CT respectively.

According to an example embodiment, source horizontal lines SHL may be formed on the source vertical lines SVL respectively. The source horizontal lines SHL may be formed together with the source vertical lines SVL when the source vertical lines SVL are formed. For example, when providing an electrically conductive material in openings for forming the source vertical lines SVL, an electrically conductive material may be provided on the upper surface of the third insulating layer 320. The electrically conductive material provided on the upper surface of the third insulating layer 320 and directly contacting the source vertical lines SVL may be defined as the source horizontal lines SHL.

The source horizontal lines SHL may extend onto the contact vertical lines CVL along the first direction DR1. Each of the source horizontal lines SHL may electrically connect the source vertical line SVL and the contact vertical line CVL immediately adjacent to each other. For example, each of the source horizontal lines SHL may directly contact the source vertical line SVL and the contact vertical line CVL immediately adjacent to each other.

The channel area C, the source area S, the drain area D, and the gate electrode G may define a preliminary driving transistor. When driving the display device 11, the preliminary driving transistor may control a light emission operation of the active pattern 232 that is immediately adjacent to the preliminary driving transistor.

Figure 7:
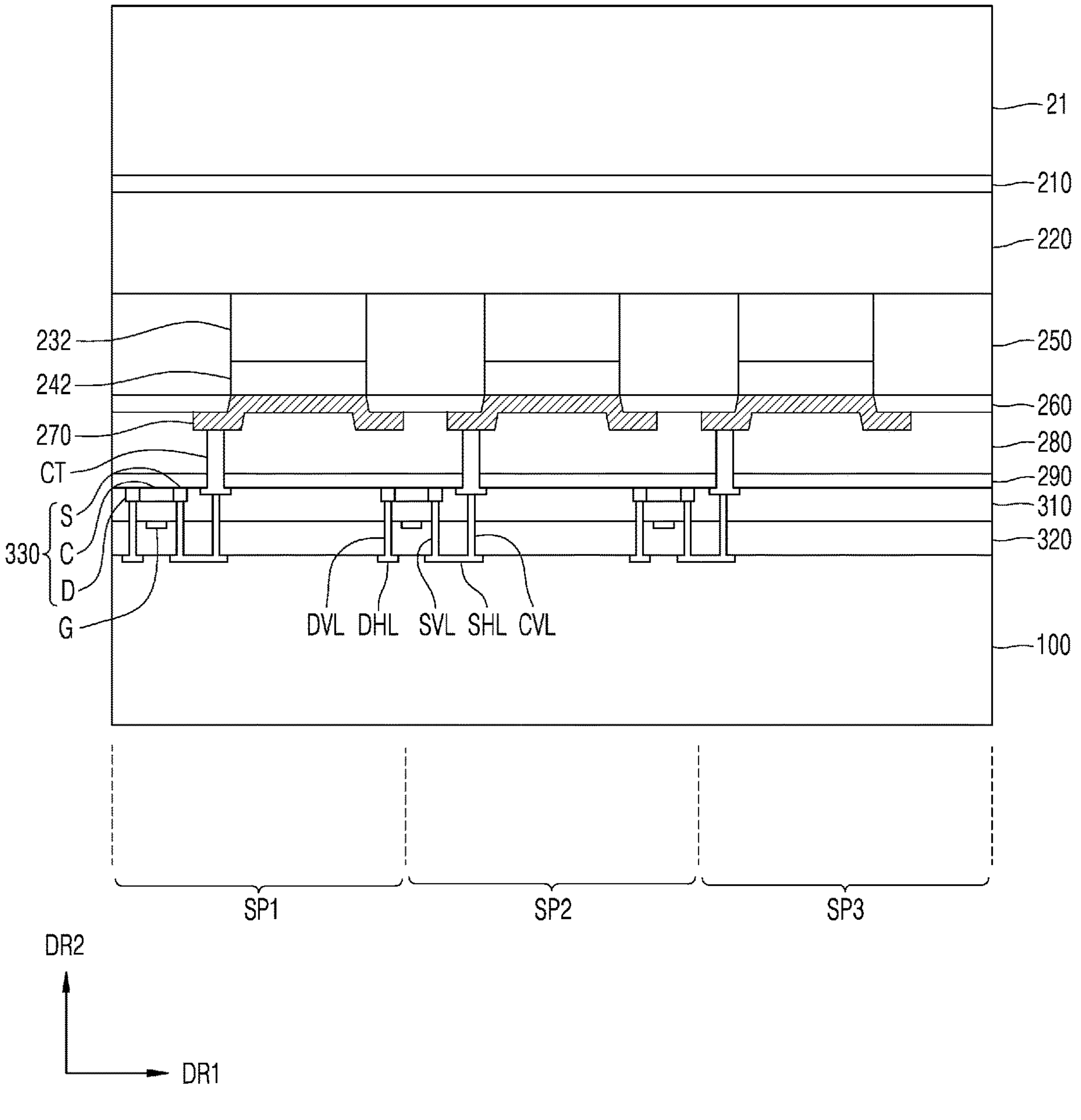

Referring to FIG. 7, the growth substrate 21 may be located at an uppermost position, and the drain horizontal line DHL and the source horizontal line SHL may be located at a lowermost position, which is flipped as compared to the illustration of FIG. 6. For convenience, hereinafter the second direction DR2 will be assumed to be opposite to the second direction DR2 of FIGS. 3 to 6. According to an example embodiment, a first sub pixel area SP1, a second sub pixel area SP2, and a third sub pixel area SP3 arranged along the first direction DR1 may be defined. Preliminary driving transistors and the active patterns 232 may be provided in each of the first to third sub pixel areas SP1 to SP3.

According to an example embodiment, a substrate 100 may be formed under the third insulating layer 320, the drain horizontal line DHL, and the source horizontal line SHL. In an example, the substrate 100 may be directly bonded to the third insulating layer 320, the drain horizontal line DHL, and the source horizontal line SHL. In another example, a bonding layer may be provided between the substrate 100 and the third insulating layer 320, drain horizontal line DHL, and source horizontal line SHL to fix the substrate 100 on the third insulating layer 320, the drain horizontal line DHL, and the source horizontal line SHL. For example, the substrate 100 may be a silicon substrate or a glass substrate.

Figure 8:
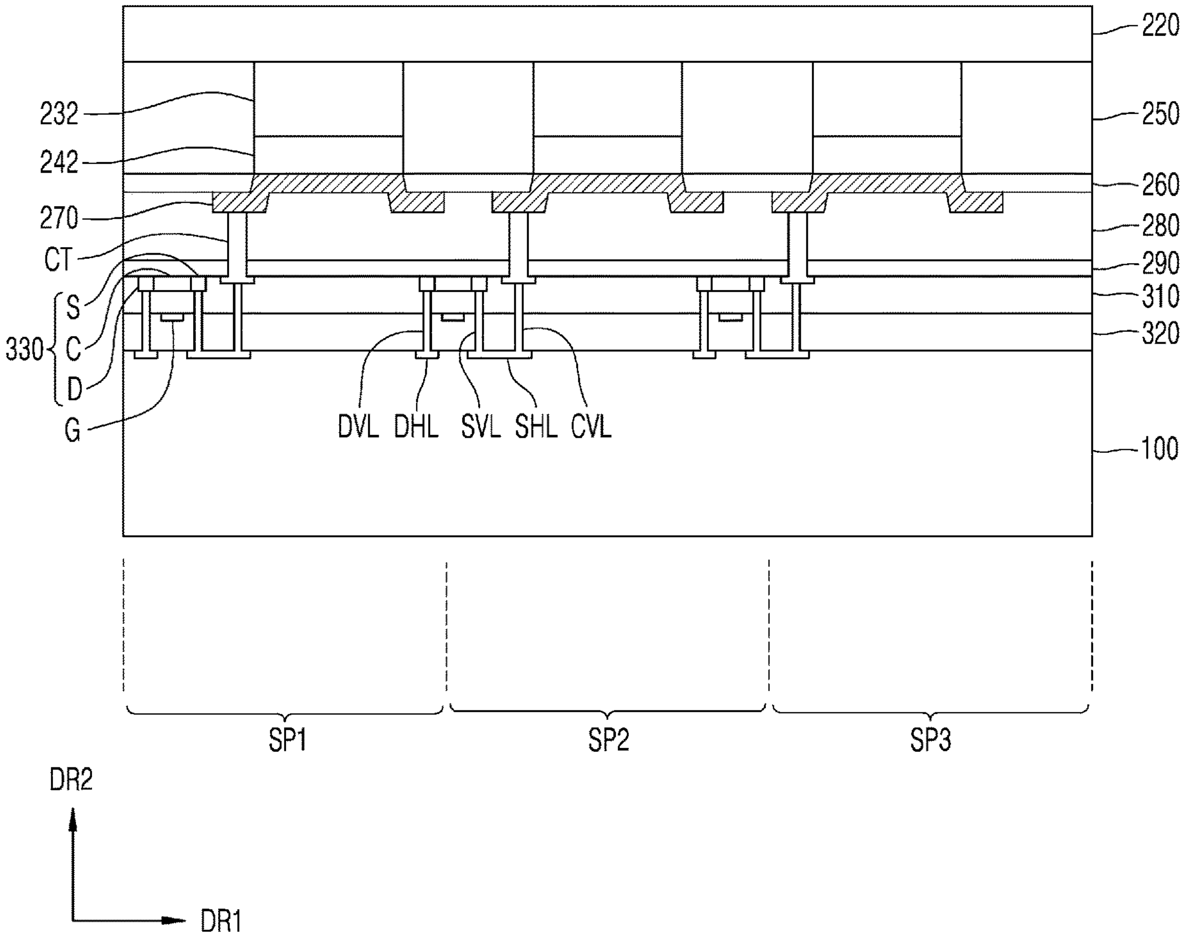

Referring to FIG. 8, the growth substrate 21 may be removed. In the case where the growth substrate 21 is a silicon substrate, removing the growth substrate 21 may include performing a polishing process and an etching process. For example, the etching process may be a dry etching process. In the case where the growth substrate 21 is a sapphire substrate, removing the growth substrate 21 may include performing a laser lift-off process. The first buffer layer 210 may be exposed since the growth substrate 21 is removed.

After performing a process of removing the growth substrate 21, an etching process may be performed on the first buffer layer 210 and the first semiconductor layer 220. Through the etching process, the first buffer layer 210 and an upper portion of the first semiconductor layer 220 may be removed. Accordingly, a thickness of the first semiconductor layer 220 may decrease. The thickness of the first semiconductor layer 220 may be a size of the first semiconductor layer 220 along the second direction DR2.

Figure 9:
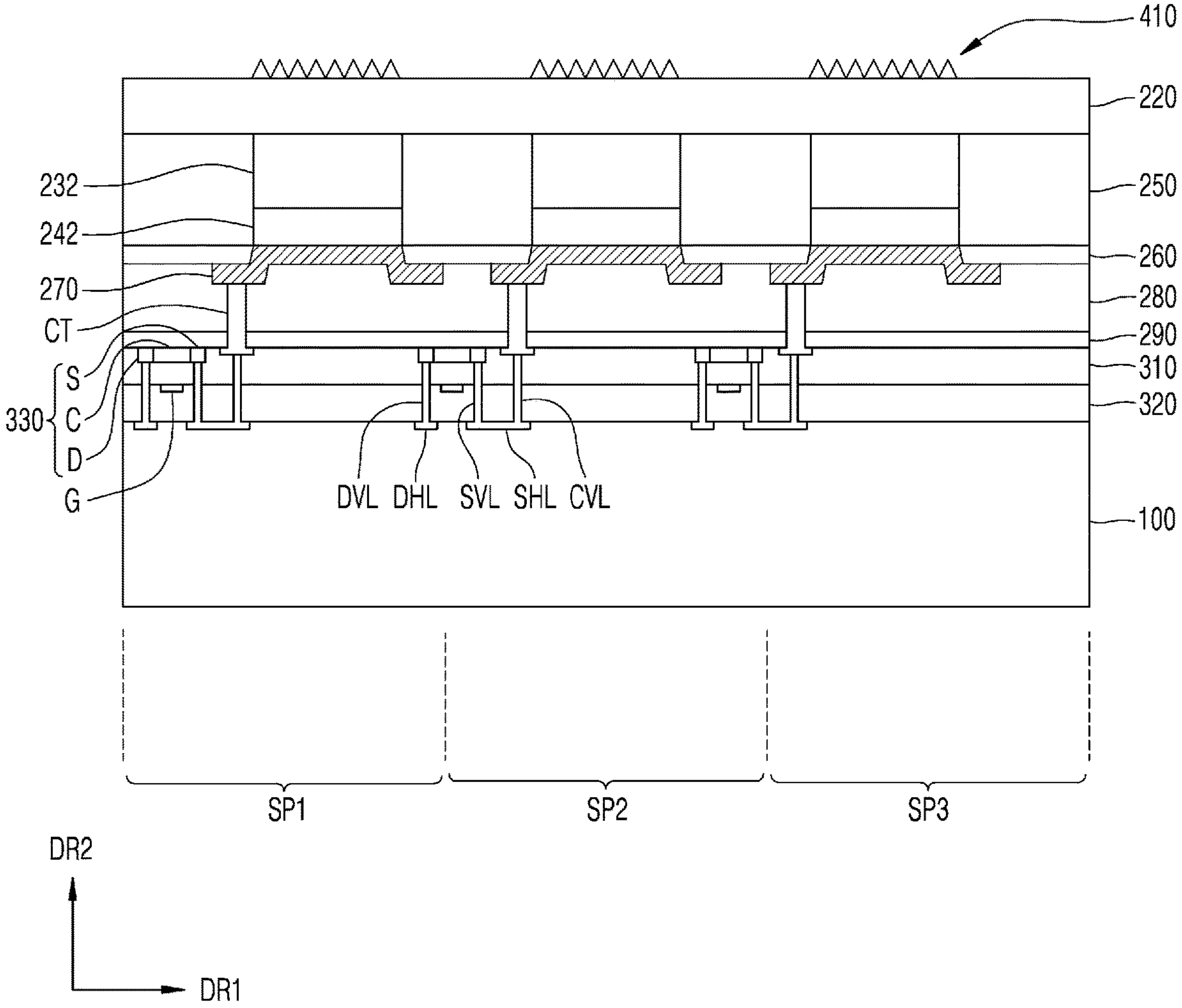

Referring to FIG. 9, light extraction patterns 410 may be formed on the first semiconductor layer 220. In an example embodiment, the light extraction patterns 410 may be formed through the etching process for the first semiconductor layer 220 described with reference to FIG. 8. In this case, the light extraction patterns 410 may form a single structure with the first semiconductor layer 220. The light extraction patterns 410 may be provided to each of the first sub pixel area SP1, the second sub pixel area SP2, and the third sub pixel area SP3. The light extraction patterns 410 may be arranged along the first direction DR1. The light extraction patterns 410 may protrude from an upper surface of the first semiconductor layer 220. The light extraction patterns 410 may be formed on the active patterns 232 respectively. The light extraction patterns 410 may overlap the active patterns 232 along the second direction DR2. The light extraction patterns 410 may improve light extraction efficiency.

Figure 10:
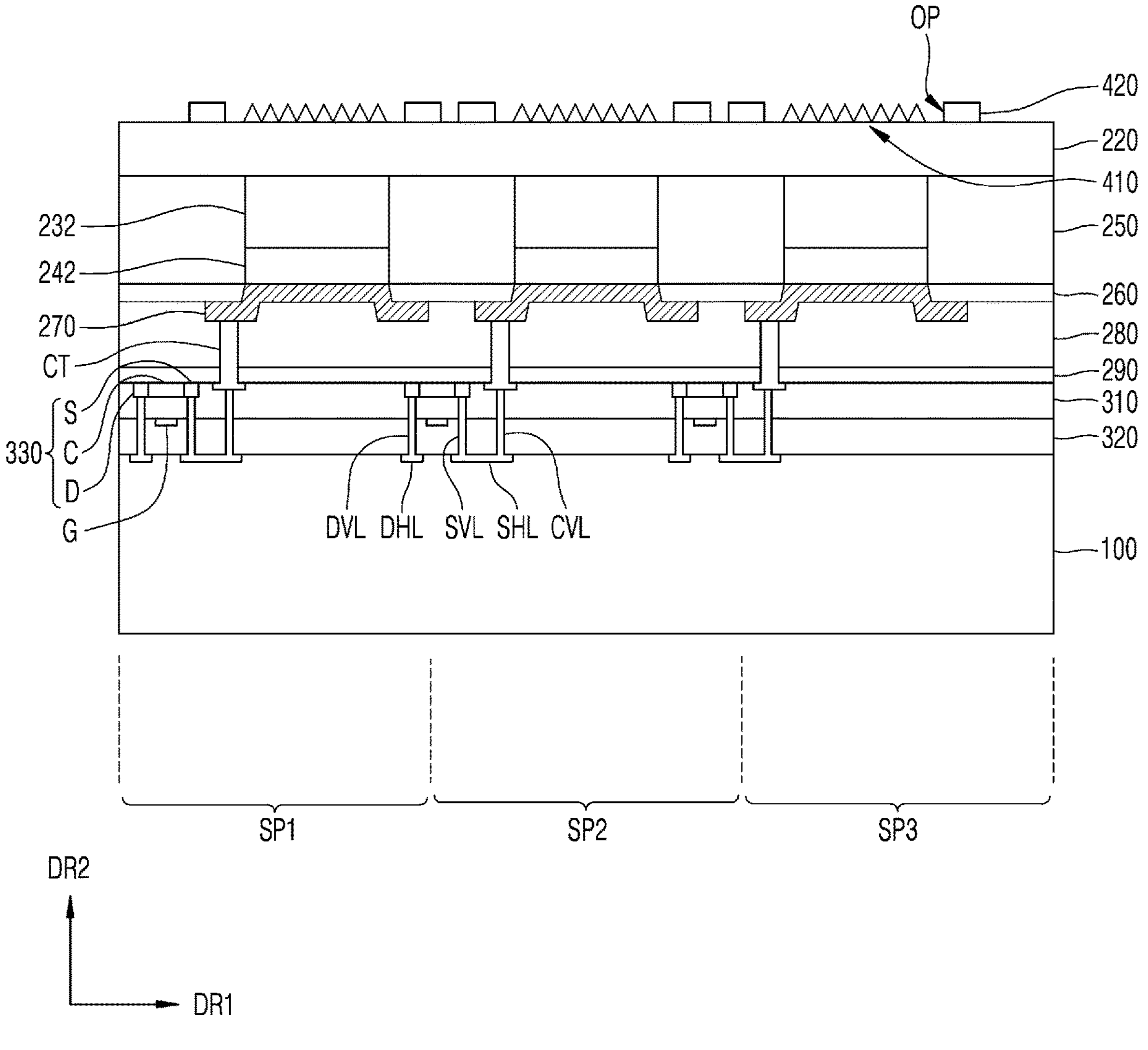
Figure 11:
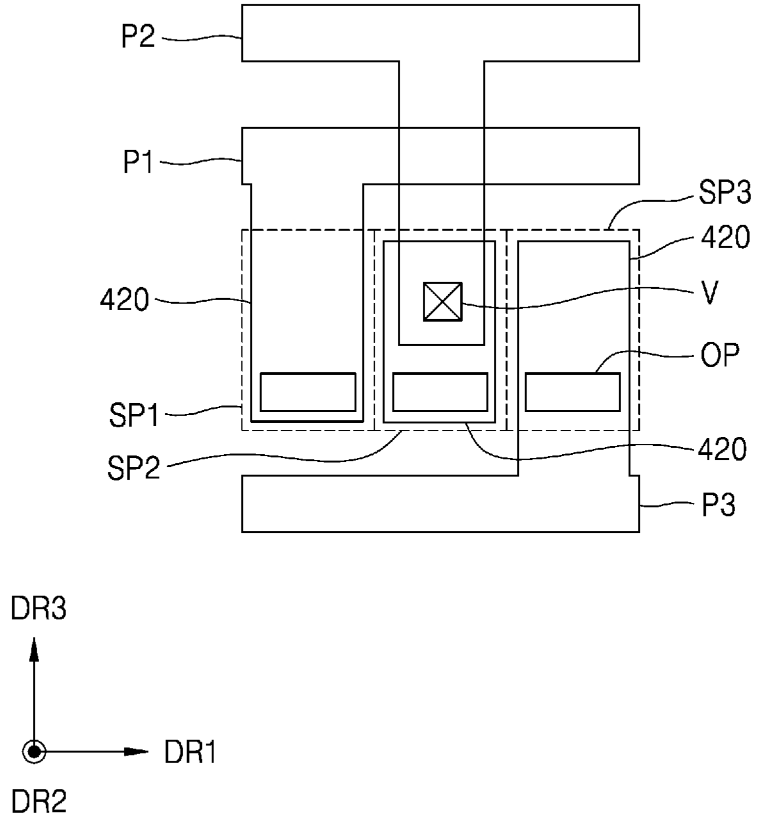

Referring to FIGS. 10 and 11, preliminary common electrodes 420 may be formed on the first semiconductor layer 220. The preliminary common electrodes 420 may be common electrodes to which the same voltage is applied when driving the display device 11. The forming of the preliminary common electrodes 420 may include forming a preliminary common electrode film on the first semiconductor layer 220 and patterning the preliminary common electrode film. The forming of the preliminary common electrode film may include, for example, performing a CVD process, a PVD process, or an ALD process. The preliminary common electrode film may include an electrically conductive material. The preliminary common electrode film may include an opaque metal or transparent conductive material. The patterning the preliminary common electrode film may include etching the preliminary common electrode film using an etching mask provided on the preliminary common electrode film. The etching mask may be removed during a process of etching the preliminary common electrode film or after the etching process is ended.

The preliminary common electrodes 420 may be provided to each of the first sub pixel area SP1, the second sub pixel area SP2, and the third sub pixel area SP3. As illustrated in FIG. 11, the preliminary common electrodes 420 may extend in parallel with an upper surface of the substrate 100 along a third direction DR3 intersecting with the first direction DR1. According to an embodiment, the preliminary common electrodes 420 may have an opening OP. As illustrated in FIG. 11, a first pad P1, a second pad P2, and a third P3 may be provided outside the first sub pixel area SP1, the second sub pixel area SP2, and the third sub pixel area SP3. The first pad P1, the second pad P2, and the third pad P3 may electrically connect the preliminary common electrodes 420 to a controller outside the first sub pixel area SP1, the second sub pixel area SP2, and the third sub pixel area SP3.

The preliminary common electrode 420 in the first sub pixel area SP1 may extend to the outside of the first sub pixel area SP1 along the third direction DR3 so as to be electrically connected to the first pad P1. The preliminary common electrode 420 in the third sub pixel area SP3 may extend to the outside of the third sub pixel area SP3 along an opposite direction to the second direction DR2 so as to be electrically connected to the third pad P3. The preliminary common electrode 420 in the second sub pixel area SP2 may be electrically connected to the second pad P2 through a via V. The via V may extend in the second direction DR2. The second pad P2 may be arranged at a higher position than the preliminary common electrodes 420. The second pad P2 may overlap the preliminary common electrode 420 in the second sub pixel area SP2 along the second direction DR2. During a process of forming first to third color adjustment patterns described below, different voltages may be applied to the preliminary common electrodes 420 in the first sub pixel area SP1, the second sub pixel area SP2, and the third sub pixel area SP3.

Figure 12:
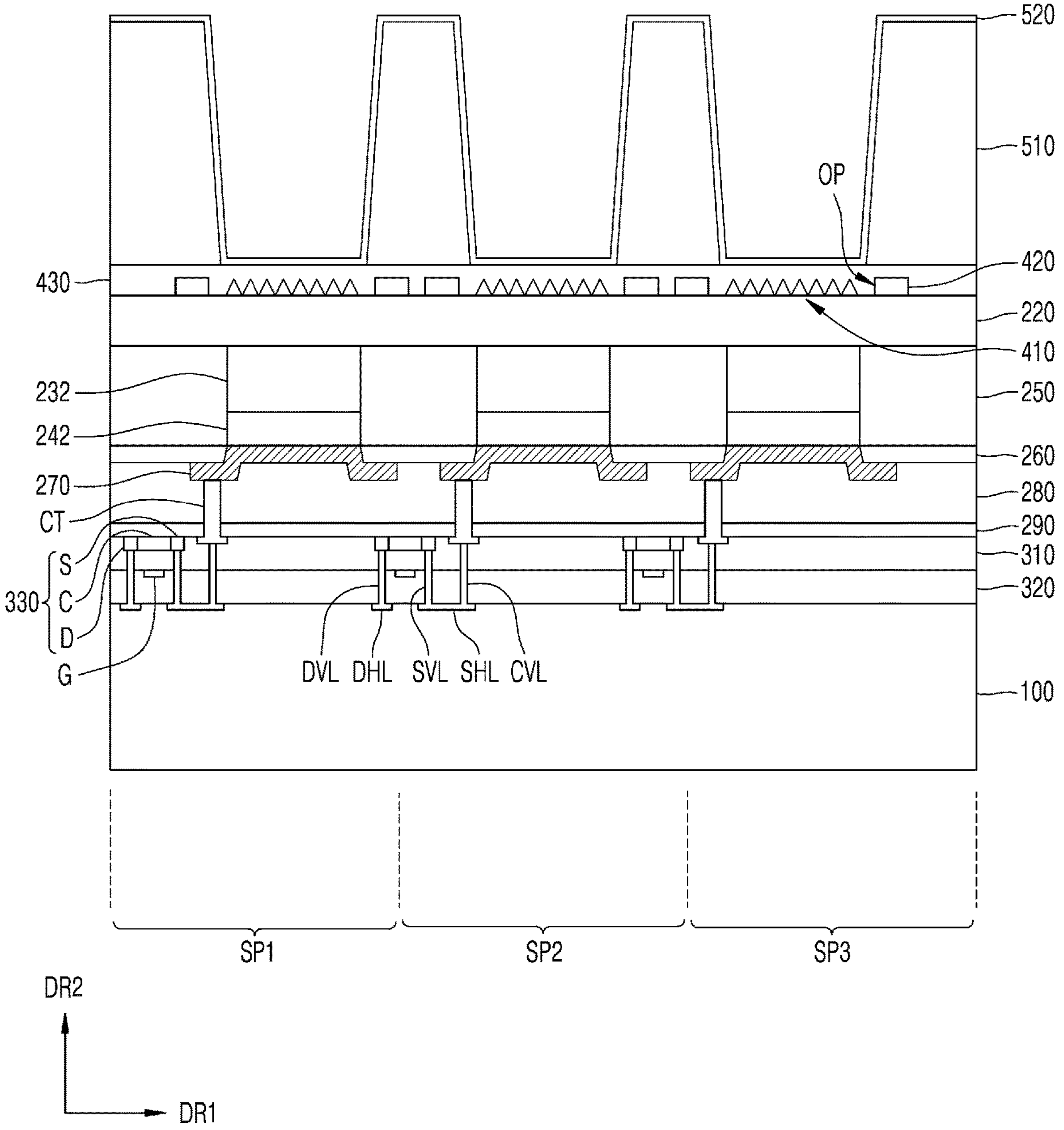

Referring to FIG. 12, a planarization layer 430 may be formed on the preliminary common electrodes 420 and the light extraction patterns 410. The forming of the planarization layer 430 may include, for example, performing a CVD process, a PVD process, or an ALD process. The planarization layer 430 may include an electrically conductive material. For example, the planarization layer 430 may include $SiO_2$, $Al_2O_3$, SiN, AlN, or a combination including one or more of $SiO_2$, $Al_2O_3$, SiN or AlN. Although an upper surface of the planarization layer 430 is illustrated as being positioned higher than upper surfaces of the preliminary common electrodes 420 and upper ends of the light extraction patterns 410, this is merely an example. In other example embodiments, the planarization layer 430 may be flush with the upper surfaces of the preliminary common electrodes 420 and the upper ends of the light extraction patterns 410. According to an example embodiment, the planarization layer 430 may be formed in the opening OP of the preliminary common electrodes 420.

According to an example embodiment, light absorbing partition walls 510 may be formed on the planarization layer 430. The forming of the light absorbing partition walls 510 may include forming a light absorbing film on the planarization layer 430 and patterning the light absorbing film. The forming of the light absorbing film may include, for example, performing a CVD process, a PVD process, or an ALD process. The patterning of the light absorbing film may include etching the light absorbing film using an etching mask provided on the light absorbing film. The above etching process may be performed until the planarization layer 430 is exposed. The etching mask may be removed during a process of etching the light absorbing film or after the etching process is ended. The light absorbing partition walls 510 may be provided over the isolation patterns 250 respectively. The light absorbing partition walls 510 may overlap the isolation patterns 250 along the second direction DR2. The light absorbing partition walls 510 may prevent crosstalk between the sub pixel areas SP1 to SP3.

According to an example embodiment, a reflective film 520 may be formed on the light absorbing partition walls 510 and the planarization layer 430. The forming of the reflective film 520 may include, for example, performing a CVD process, a PVD process, or an ALD process. The reflective film 520 may reflect light. For example, the reflective film 520 may include at least one of silver (Ag), aluminum (Al), indium (In), titanium (Ti), nickel (Ni), copper (Cu), chromium (Cr), gold (Au), palladium (Pd), tungsten (W), or platinum (Pt). The reflective film 520 may conformably extend on the light absorbing partition wall 510 and the planarization layer 430.

Figure 13:
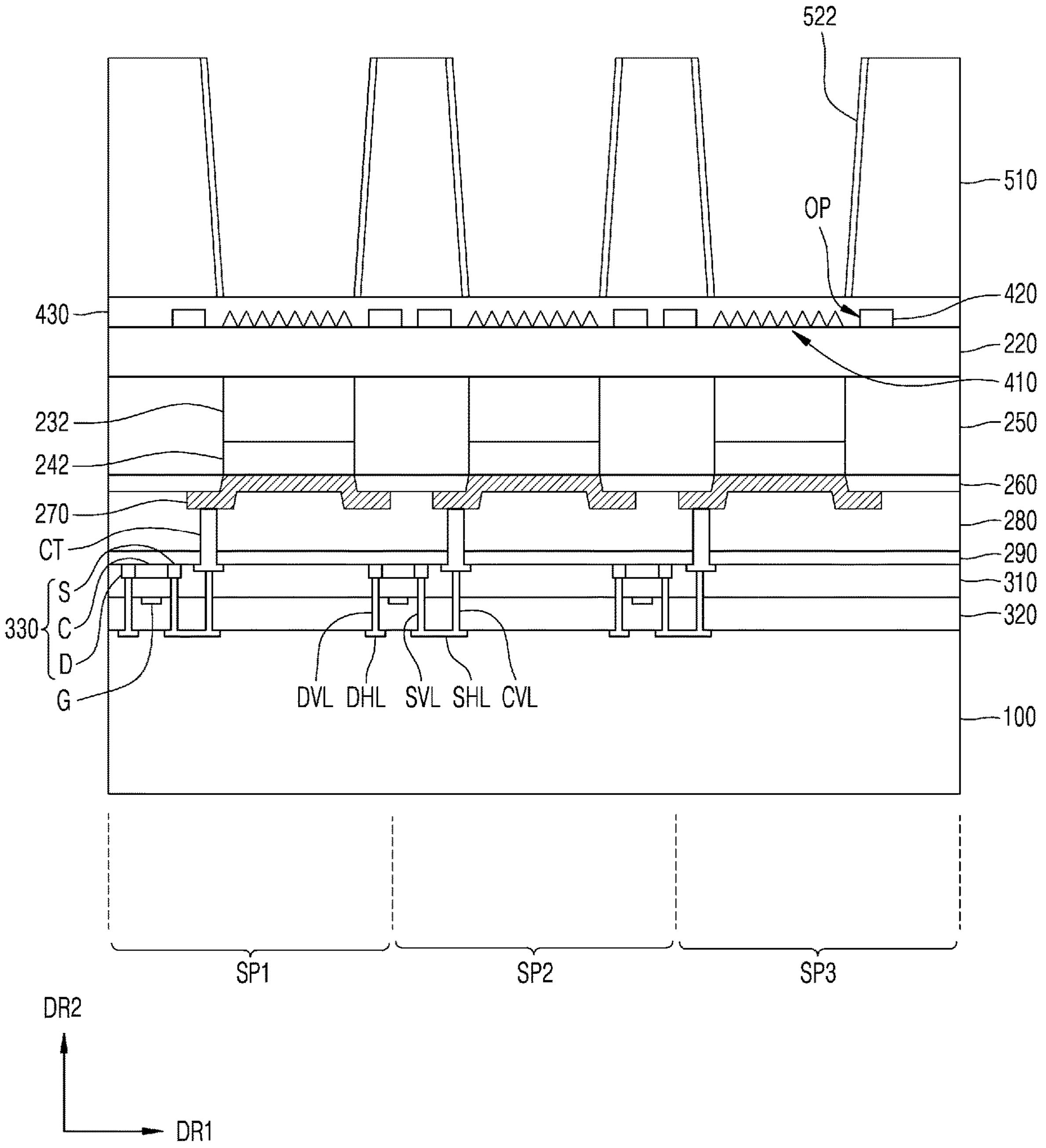

Referring to FIG. 13, reflection patterns 522 may be formed on side surfaces of the light absorbing partition walls 510. The forming of the reflection patterns 522 may include exposing upper surfaces of the planarization layer 430 and the light absorbing partition walls 510 by performing an anisotropic etching process on the reflective film. In another example, the reflective film on the upper surfaces of the light absorbing partition walls 510 may not be removed. In other words, the reflection patterns 522 may be provided on two side surfaces of the light absorbing partition wall 510 and the upper surface therebetween.

Figure 14:
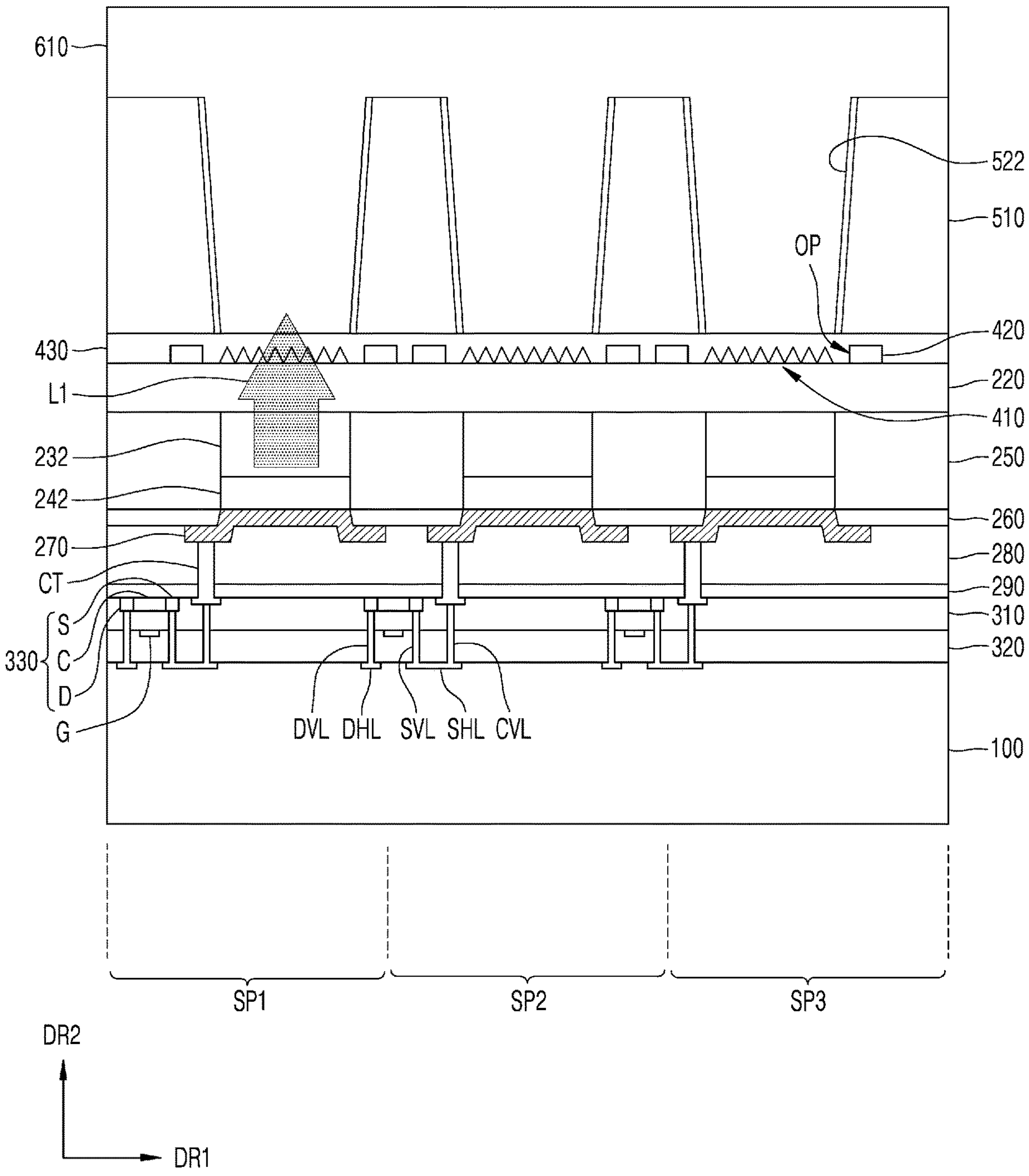

Referring to FIG. 14, a first color adjustment material layer 610 may be formed on the planarization layer 430, the light absorbing partition walls 510, and the reflection patterns 522. The forming of the first color adjustment material layer 610 may include, for example, performing a spin coating process or a spray coating process. The first color adjustment material layer 610 may fill areas between the light absorbing partition walls 510 in the first to third sub pixel areas SP1 to SP3.

The first color adjustment material layer 610 may include quantum dots (QDs) or phosphor which is excited by blue light to emit red light. The quantum dot may have a core-shell structure with a core portion and a shell portion, or may have a particle structure without a shell. The core-shell structure may have a single-shell or multi-shell. For example, the multi-shell may be a double-shell. In example embodiments, the quantum dot may include at least one of Group II-VI compound semiconductors, Group III-V compound semiconductors, Group IV-VI compound semiconductors, Group IV semiconductors, or graphene quantum dots. For example, the quantum dot may include at least one of Cd, Se, Zn, S, or InP, but is not limited thereto. The quantum dot may have a diameter of dozens of nanometers or less. For example, the diameter of the quantum dot may be about 10 nm or less. The first color adjustment material layer 610 may include a photoresist and a light scattering agent.

A first light L1 emitted from the active pattern 232 in the first sub pixel area SP1 may be radiated to the first color adjustment material layer 610. Radiating the first light L1 may include applying a first voltage to the preliminary common electrode 420 in the first sub pixel area SP1, applying a second voltage that is lower than the first voltage to at least one of the preliminary common electrode 420 in the second sub pixel area SP2 or the preliminary common electrode 420 in the third sub pixel area SP3, and applying a ground voltage to the substrate 100. According to an example embodiment, the preliminary driving transistor in FIG. 14 may not function as a transistor when the ground voltage is applied to the substrate 100. Instead, according to an example embodiment, the preliminary driving transistor may provide an electric path for the ground voltage. According to an example embodiment, when the ground voltage is applied to the substrate 100, the ground voltage may be applied to the source horizontal line SHL because the SHL is electrically connected to the substrate 100. However, the disclosure is not limited thereto. According to an example embodiment, the ground voltage may be applied to the active pattern 232 through a source vertical line SVL, a contact CT, a reflective electrode 270, and a second semiconductor pattern 242. In an example, the first voltage may be from about 5 V to about 6 V, and the second voltage may be from about −3.5 V to about 3 V. For example, the first light L1 may be blue light. The first color adjustment material layer 610 may be cured by the first light L1.

Figure 15:
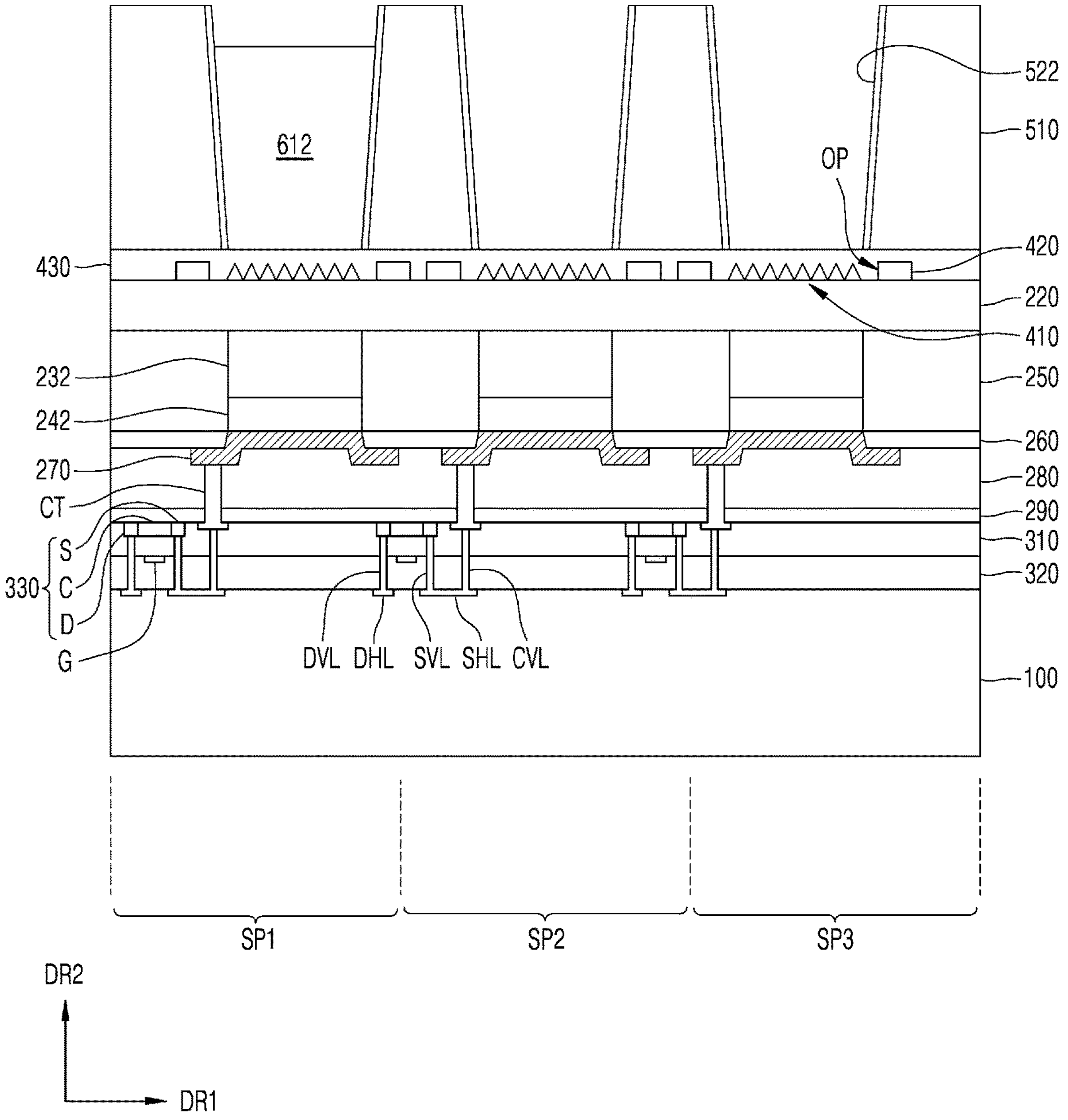

Referring to FIG. 15, a first color adjustment pattern 612 may be formed between a pair of the light absorbing partition walls 510 in the first sub pixel area SP1. The forming of the first color adjustment pattern 612 may include removing an uncured portion of the first color adjustment material layer 610. For example, removing the uncured portion may include performing a developing process. In example embodiments, the first color adjustment pattern 612 may receive blue light to emit red light.

The first color adjustment pattern 612 may be formed by radiating, under the first color adjustment material layer 610, the first light L1 to the first color adjustment material layer 610. Accordingly, the first color adjustment pattern 612 may be stably formed between a pair of the light absorbing partition walls 510.

Figure 16:
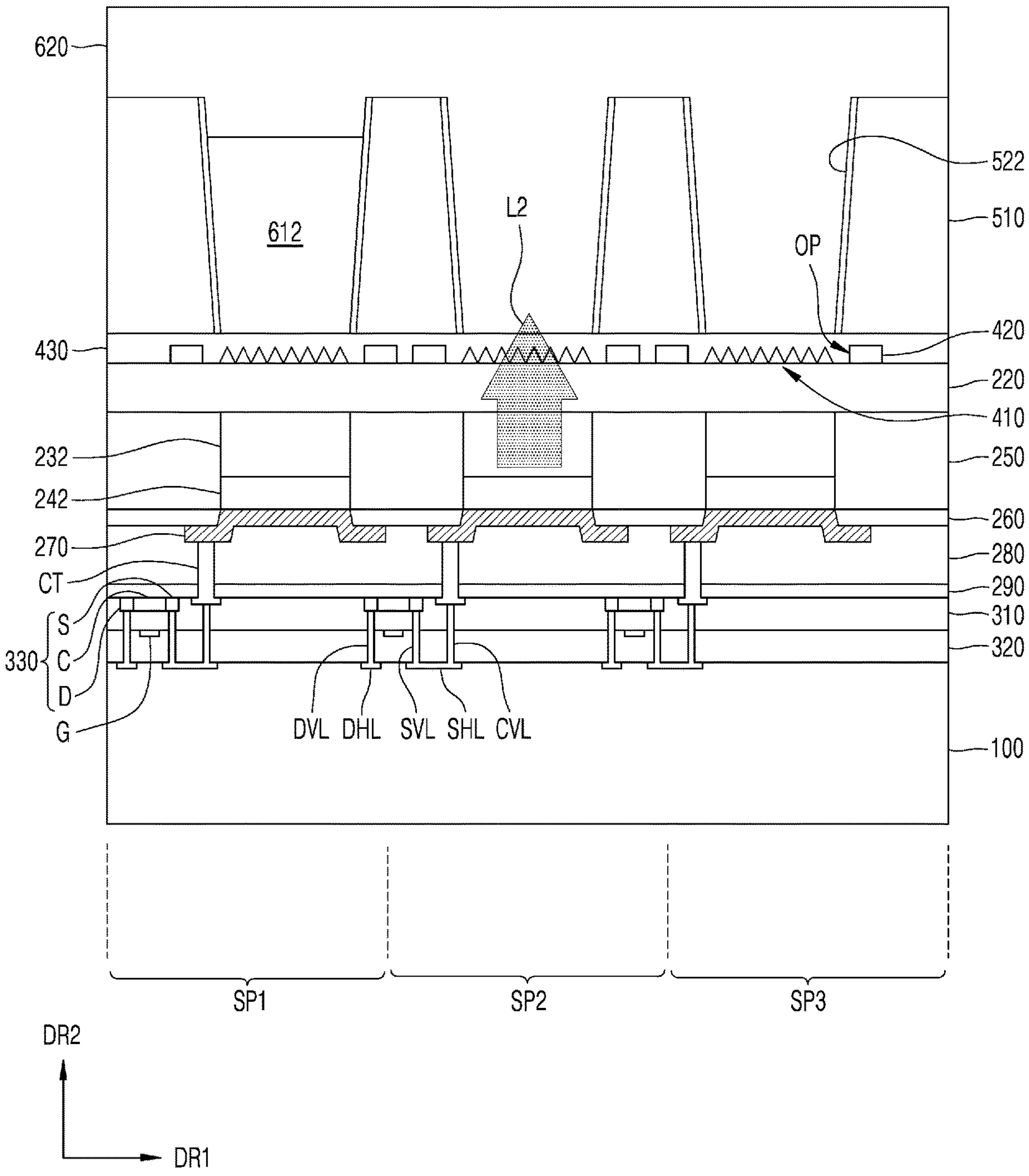

Referring to FIG. 16, a second color adjustment material layer 620 may be formed on the planarization layer 430, the light absorbing partition walls 510, the reflection patterns 522, and the first color adjustment pattern 612. The forming of the second color adjustment material layer 620 may include, for example, performing a spin coating process or a spray coating process. The second color adjustment material layer 620 may fill areas between the light absorbing partition walls 510 in the second and third sub pixel areas SP2 and SP3. The second color adjustment material layer 620 may include a photoresist and a light scattering agent. A second light L2 emitted from the active pattern 232 in the second sub pixel area SP2 may be radiated to the second color adjustment material layer 620.

Radiating the second light L2 may include applying a third voltage to the preliminary common electrode 420 in the second sub pixel area SP2, applying a fourth voltage that is lower than the third voltage to at least one of the preliminary common electrode 420 in the first sub pixel area SP1 or the preliminary common electrode 420 in the third sub pixel area SP3, and applying a ground voltage to the substrate 100. In an example, the third voltage may be from about 5 V to about 6 V, and the fourth voltage may be from about −3.5 V to about 3 V. For example, the second light L2 may be blue light. The second color adjustment material layer 620 may be cured by the second light L2.

Figure 17:
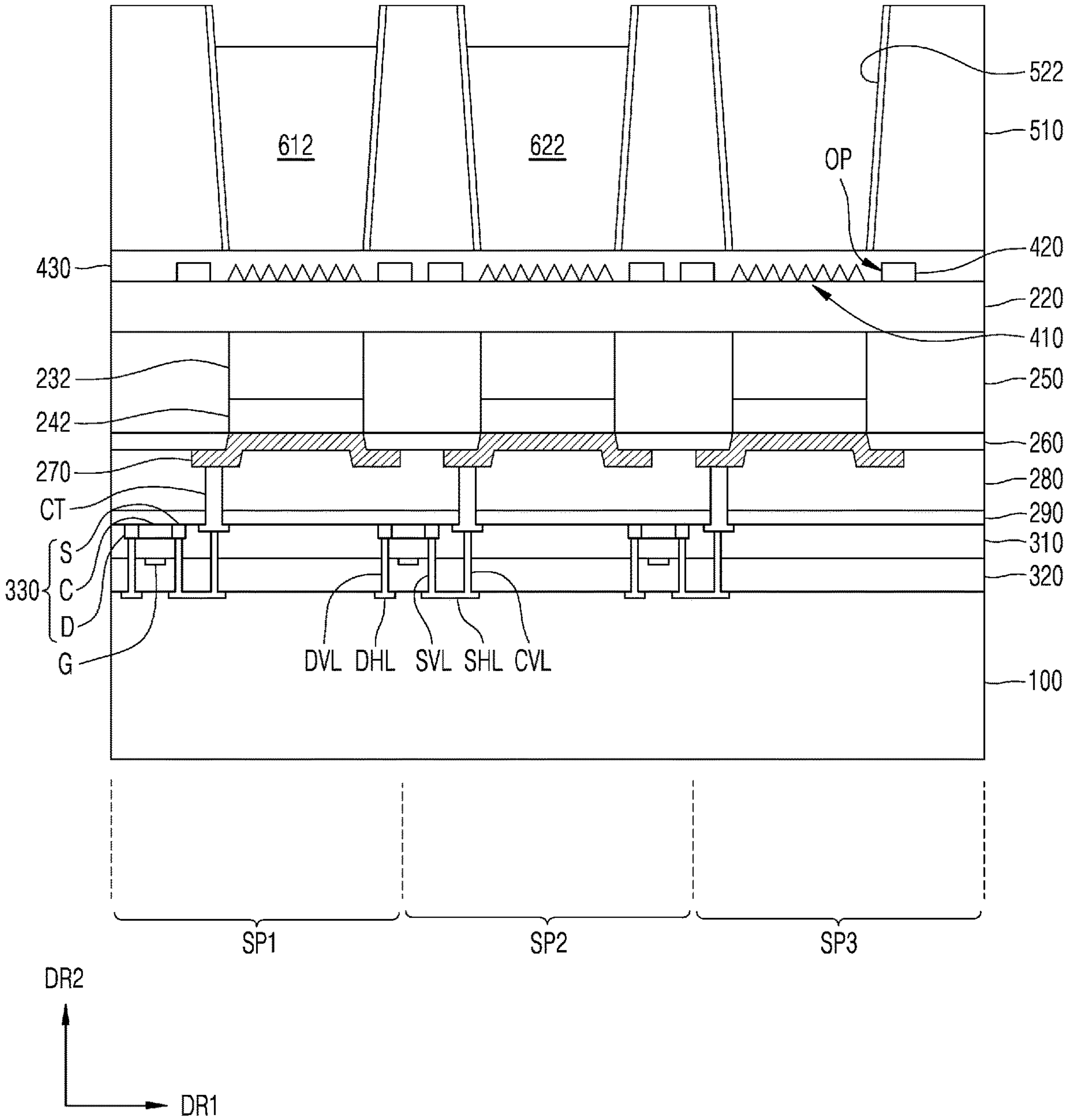

Referring to FIG. 17, a second color adjustment pattern 622 may be formed between a pair of the light absorbing partition walls 510 in the second sub pixel area SP2. The forming of the second color adjustment pattern 622 may include removing an uncured portion of the second color adjustment material layer 620. For example, removing the uncured portion may include performing a developing process. In example embodiments, the second color adjustment pattern 622 may receive blue light to emit blue light.

The second color adjustment pattern 622 may be formed by radiating, under the second color adjustment material layer 620, the second light L2 to the second color adjustment material layer 620. Accordingly, the second color adjustment pattern 622 may be stably formed between a pair of the light absorbing partition walls 510.

Figure 18:
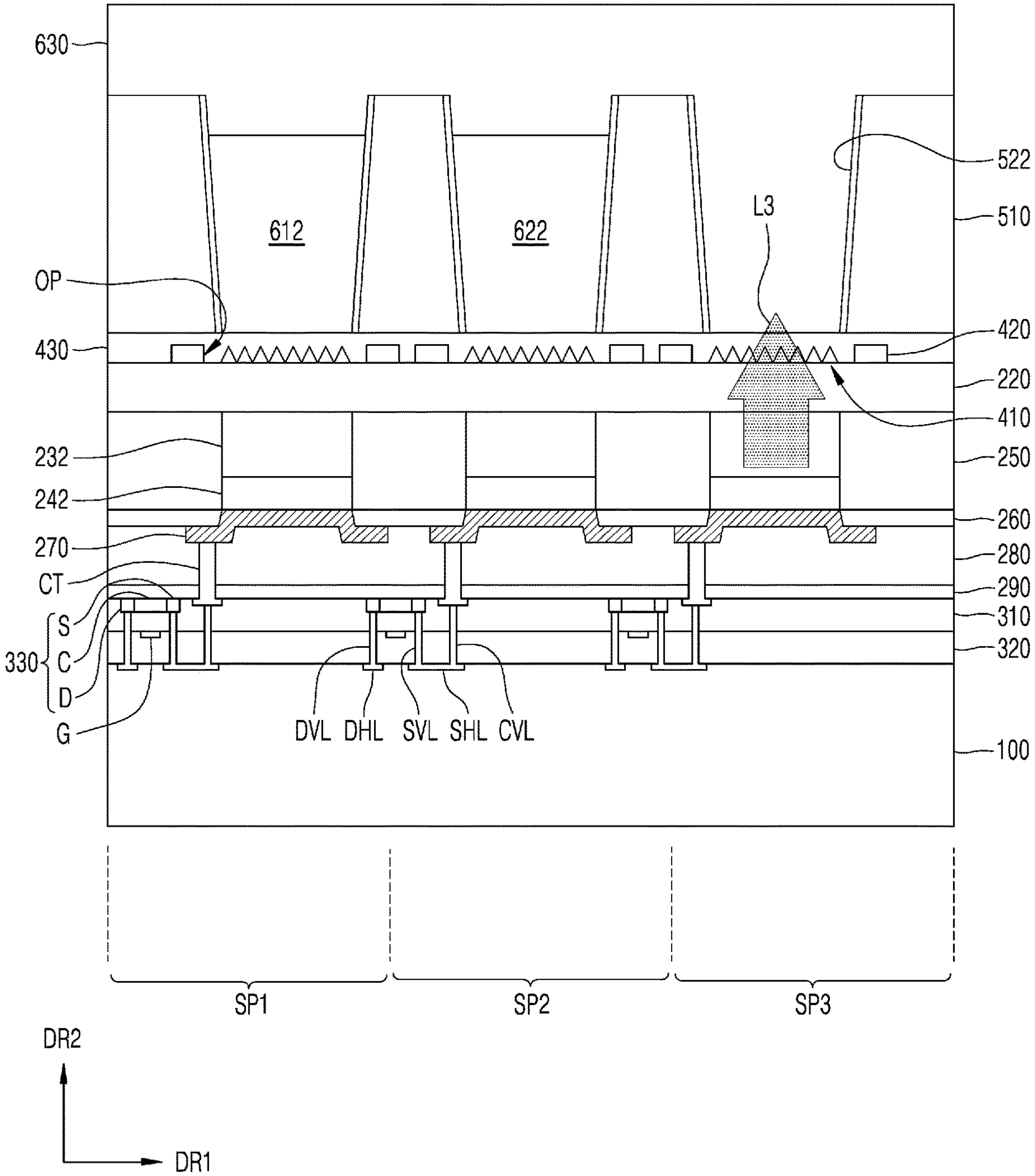

Referring to FIG. 18, a third color adjustment material layer 630 may be formed on the planarization layer 430, the light absorbing partition walls 510, the reflection patterns 522, the first color adjustment pattern 612, and the second color adjustment pattern 622. The forming of the third color adjustment material layer 630 may include, for example, performing a spin coating process or a spray coating process. The third color adjustment material layer 630 may fill an area between the light absorbing partition walls 510 in the third sub pixel area SP3. The third color adjustment material layer 630 may include quantum dots (QDs) or phosphor which is excited by blue light to emit green light. The third color adjustment material layer 630 may include a photoresist and a light scattering agent. A third light L3 emitted from the active pattern 232 in the third sub pixel area SP3 may be radiated to the third color adjustment material layer 630. Radiating the third light L3 may include applying a fifth voltage to the preliminary common electrode 420 in the third sub pixel area SP3, applying a sixth voltage that is lower than the fifth voltage to at least one of the preliminary common electrode 420 in the first sub pixel area SP1 or the preliminary common electrode 420 in the second sub pixel area SP2, and applying a ground voltage to the substrate 100. In an example, the fifth voltage may be from about 5 V to about 6 V, and the sixth voltage may be from about −3.5 V to about 3 V. For example, the third light L3 may be blue light. The third color adjustment material layer 630 may be cured by the third light L3.

Figure 19:
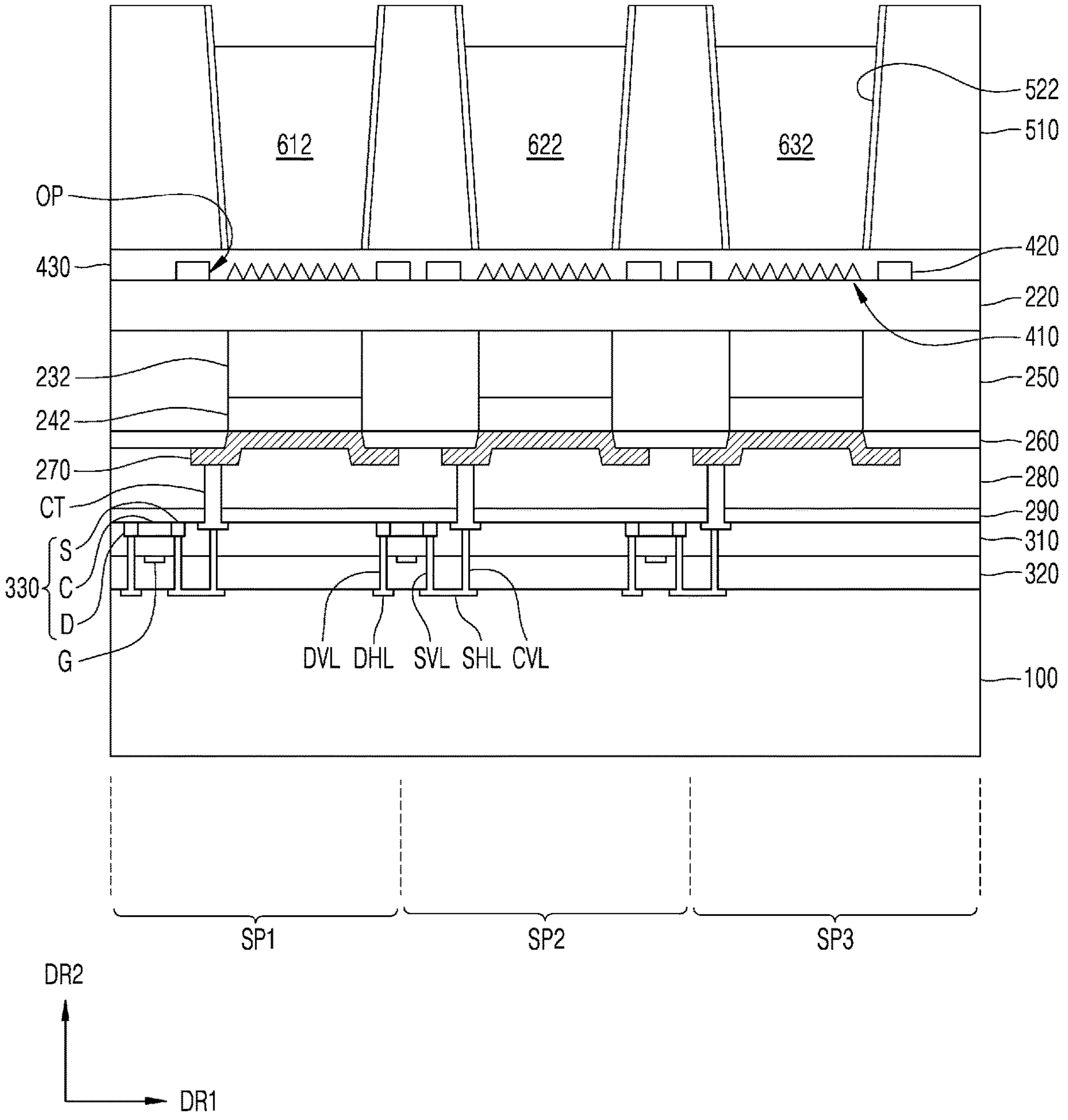

Referring to FIG. 19, a third color adjustment pattern 632 may be formed between a pair of the light absorbing partition walls 510 in the third sub pixel area SP3. The forming of the third color adjustment pattern 632 may include removing an uncured portion of the third color adjustment material layer 630. For example, removing the uncured portion may include performing a developing process. In example embodiments, the third color adjustment pattern 632 may receive blue light to emit green light.

The third color adjustment pattern 632 may be formed by radiating, under the third color adjustment material layer 630, the third light L3 to the third color adjustment material layer 630. Accordingly, the third color adjustment pattern 632 may be stably formed between a pair of the light absorbing partition walls 510.

Figure 20:
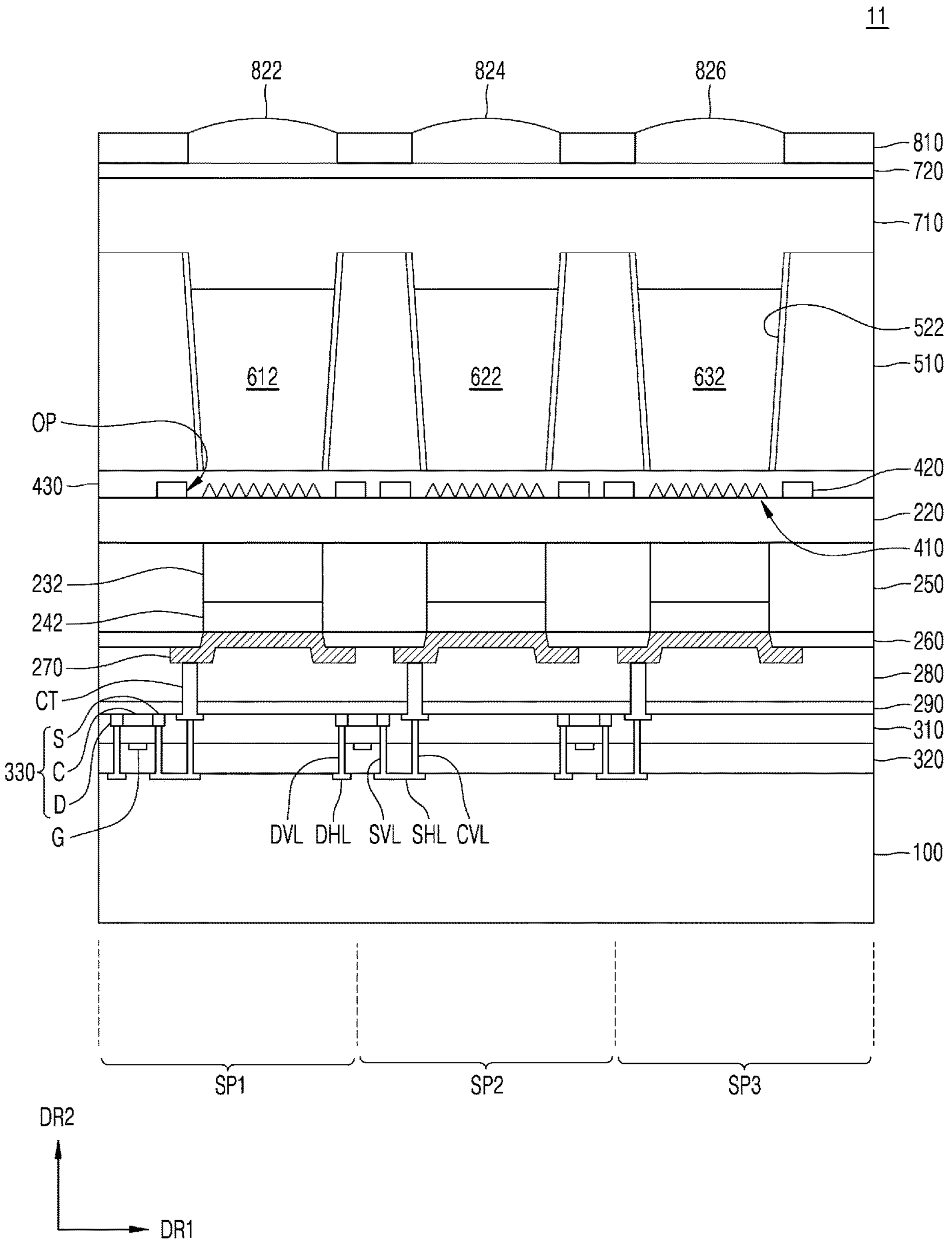

Referring to FIG. 20, a fourth insulating layer 710 may be formed on the light absorbing partition walls 510, the reflection patterns 522, the first color adjustment pattern 612, the second color adjustment pattern 622, and the third color adjustment pattern 632. The forming of the fourth insulating layer 710 may include, for example, performing a CVD process, a PVD process, or an ALD process. The fourth insulating layer 710 may extend along the first direction DR1. The fourth insulating layer 710 may include $SiO_2$, $Al_2O_3$, SiN, AlN, or a combination thereof.

According to an example embodiment, an encapsulation layer 720 may be formed on the fourth insulating layer 710. The forming of the encapsulation layer 720 may include, for example, performing a CVD process, a PVD process, or an ALD process. The encapsulation layer 720 may include an insulating material. For example, the encapsulation layer 720 may include $SiO_2$, $Al_2O_3$, SiN, AlN, or a combination thereof.

According to an example embodiment, black matrix patterns 810 may be formed on the encapsulation layer 720. The black matrix patterns 810 may be provided on the light absorbing partition walls 510 respectively. The black matrix patterns 810 may overlap the light absorbing partition walls 510 along the third direction DR3. The black matrix patterns 810 may absorb light. The black matrix patterns 810 may prevent a crosstalk phenomenon between the first to third sub pixel areas SP1 to SP3.

According to an example embodiment, a first color filter 822 may be formed over the first color adjustment pattern 612. For example, the first color filter 822 may pass red light. In other words, the first color filter 822 may block lights other than red light. Accordingly, the first sub pixel area SP1 may emit red light to the outside of the display device 11.

According to an example embodiment, a second color filter 824 may be formed over the second color adjustment pattern 622. For example, the second color filter 824 may pass blue light. In other words, the second color filter 824 may block lights other than blue light. Accordingly, the second sub pixel area SP2 may emit blue light to the outside of the display device 11.

According to an example embodiment, a third color filter 826 may be formed over the third color adjustment pattern 632. For example, the third color filter 826 may pass green light. In other words, the third color filter 826 may block lights other than green light. Accordingly, the third sub pixel area SP3 may emit green light to the outside of the display device 11. Accordingly, the display device 11 may be formed.

An operation method of the display device 11 is described below. After a manufacturing process of the display device 11 is completed, the preliminary common electrodes 420 may be referred to as common electrodes 420. A common voltage may be applied to the first to third pads P1 to P3 so as to apply common voltages to the common electrodes 420. While voltages, i.e., a ground voltage, may be applied to the substrate 100 during the manufacturing method of the display device 11, such voltages including a ground voltage may not be applied to the substrate 100.

The preliminary driving transistors may be referred to as driving transistors. The drain areas D of the driving transistors may be electrically connected to the data lines DL extending from the data driver 4 described with reference to FIG. 2. The gate electrodes G of the driving transistors may be electrically connected to the scan lines SL extending from the scan driver 3 described with reference to FIG. 2.

When the scan driver 3 applies a scan signal to one scan line SL, and the data driver 4 applies a data signal to one data line DL, light may be emitted from the active pattern 232 in one sub pixel area including the gate electrode G electrically connected to the one scan line SL and the drain area D electrically connected to the one data line DL.

In a related method of manufacturing a display device, where lights for curing the first to third color adjustment material layers 610, 620, and 630 are radiated from above the first to third color adjustment material layers 610, 620, and 630 when forming the first to third color adjustment patterns 612, 622, and 632, the lights may not reach lower portions of the first to third color adjustment material layers 610, 620, and 630. In this case, the lower portions of the first to third color adjustment material layers 610, 620, and 630 may not be cured. Therefore, the first to third color adjustment patterns 612, 622, and 632 may not be stably formed between the light absorbing partition walls 510. When the first to third color adjustment patterns 612, 622, and 632 are unstably formed, all or some of the first to third color adjustment patterns 612, 622, and 632 may be peeled or detached between the light absorbing partition walls 510.

The manufacturing method of the display device 11 according to an embodiment may include forming the first to third color adjustment patterns 612, 622, and 632 by radiating, under the first to third color adjustment material layers 610, 620, and 630, the first to third lights L1 to L3 to the first to third color adjustment material layers 610, 620, and 630. Since the first to third lights L1 to L3 are firstly radiated to the lower portions of the first to third color adjustment material layers 610, 620, and 630, the lower portions of the first to third color adjustment material layers 610, 620, and 630 may be cured. Therefore, the first to third color adjustment patterns 612, 622, and 632 may be stably formed between the light absorbing partition walls 510. As a result, a defect rate of a manufacturing process of the display device 11 may be reduced, and thus the yield may be improved, and durability of the display device 11 may increase.

Figure 21:
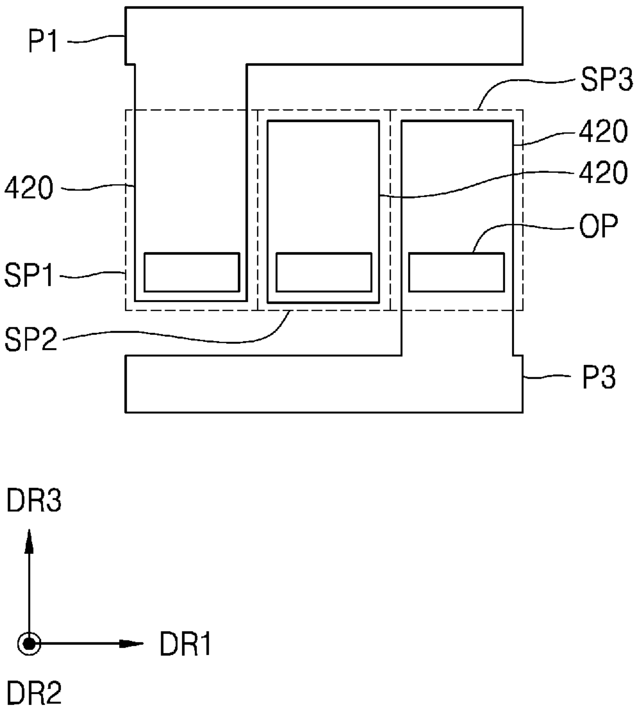
FIG. 21 is a plan view for describing a method of manufacturing a display device according to example embodiments.
Figure 22:
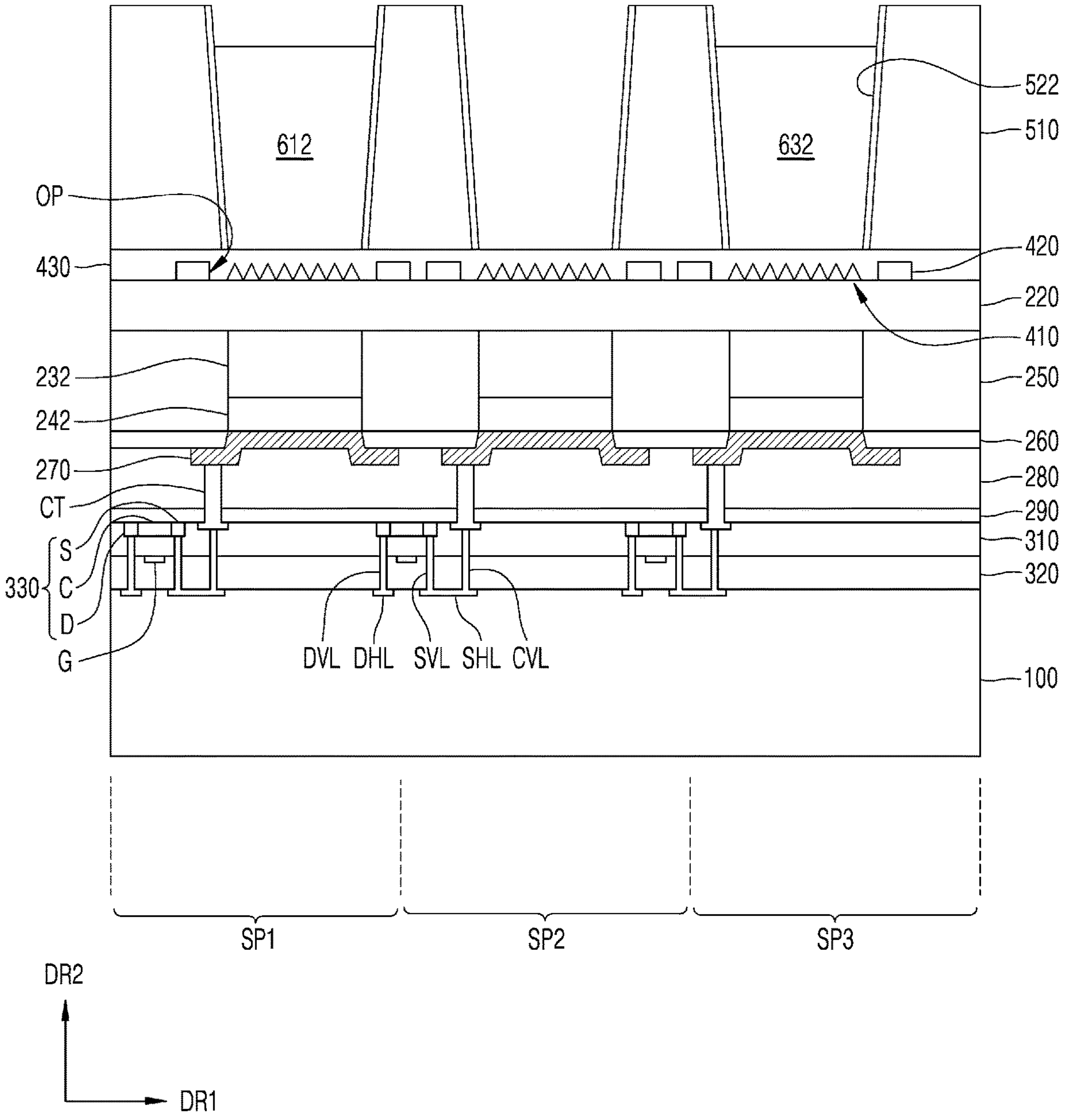
FIGS. 22 and 23 are cross-sectional views for describing a method of manufacturing a display device according to example embodiments.
Figure 23:
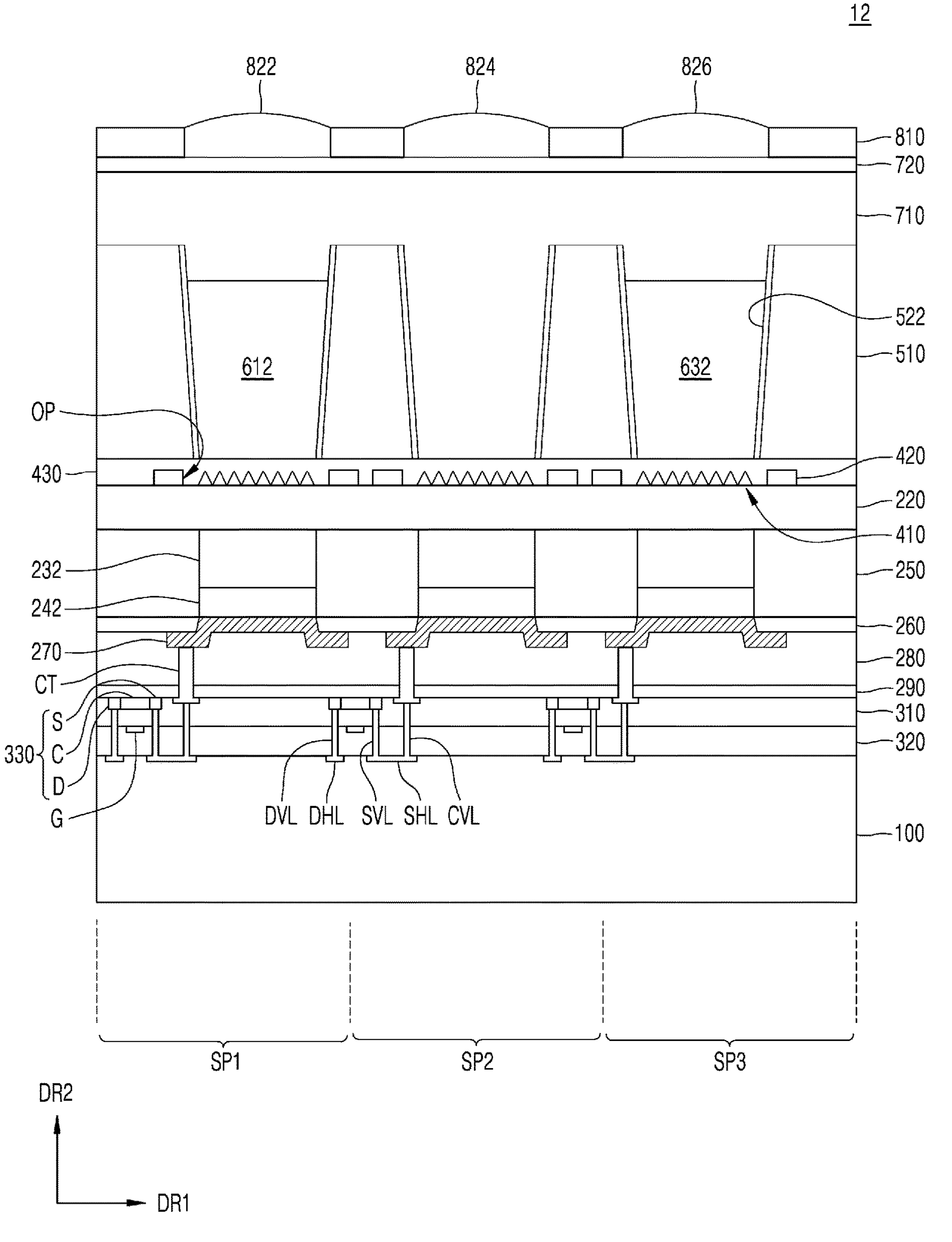

FIG. 21 is a planar view for describing a method of manufacturing a display device 12 according to example embodiments. FIGS. 22 and 23 are cross-sectional views for describing a method of manufacturing the display device 12 according to example embodiments. For conciseness, substantially the same descriptions as provided above with reference to FIGS. 3 to 20 may not be provided below.

Referring to FIG. 21, in the display device 12, the preliminary common electrode 420 in the second sub pixel area SP2 may not be electrically connected to another electrical wiring or pad. That is, the preliminary common electrode 420 in the second sub pixel area SP2 may be a floating electrode. The display device 12 may not include the second pad. Therefore, during a manufacturing process of the display device 12, the active pattern 232 in the second sub pixel area SP2 may not generate the second light.

Referring to FIG. 22, the first color adjustment pattern 612 and the third color adjustment pattern 632 may be formed. Since the active pattern 232 in the second sub pixel area SP2 does not generate the second light L2, the process of forming the second adjustment pattern described with reference to FIGS. 16 and 17 may not be performed.

Referring to FIG. 23, the fourth insulating layer 710 may be formed on the light absorbing partition walls 510, the reflection patterns 522, the first color adjustment pattern 612, and the third color adjustment pattern 632. Unlike the fourth insulating layer described with reference to FIG. 20, the fourth insulating layer 710 may extend to an area between the light absorbing partition walls 510 in the second sub pixel area SP2. The fourth insulating layer 710 may fill an area between the light absorbing partition walls 510 in the second sub pixel area SP2. Accordingly, light emitted from the active pattern 232 in the second sub pixel area SP2 may pass through the fourth insulating layer 710 to reach the second color filter 824 without passing through the second color adjustment pattern (622 in FIG. 17) described with reference to FIG. 17.

The disclosure may provide a manufacturing method of the display device 12 by which the yield may be improved, and provide the display device 12 with improved durability.

Figure 24:
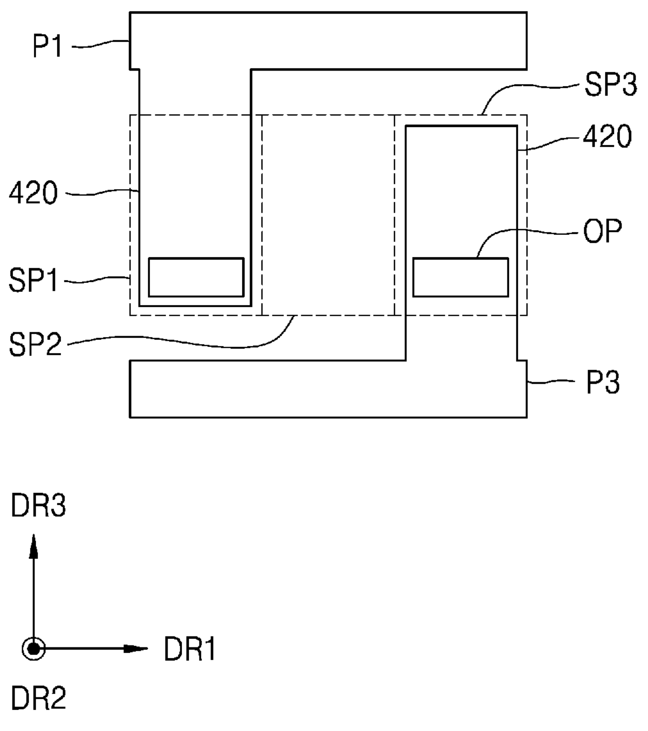
FIG. 24 is a plan view for describing a method of manufacturing a display device according to example embodiments.
Figure 25:
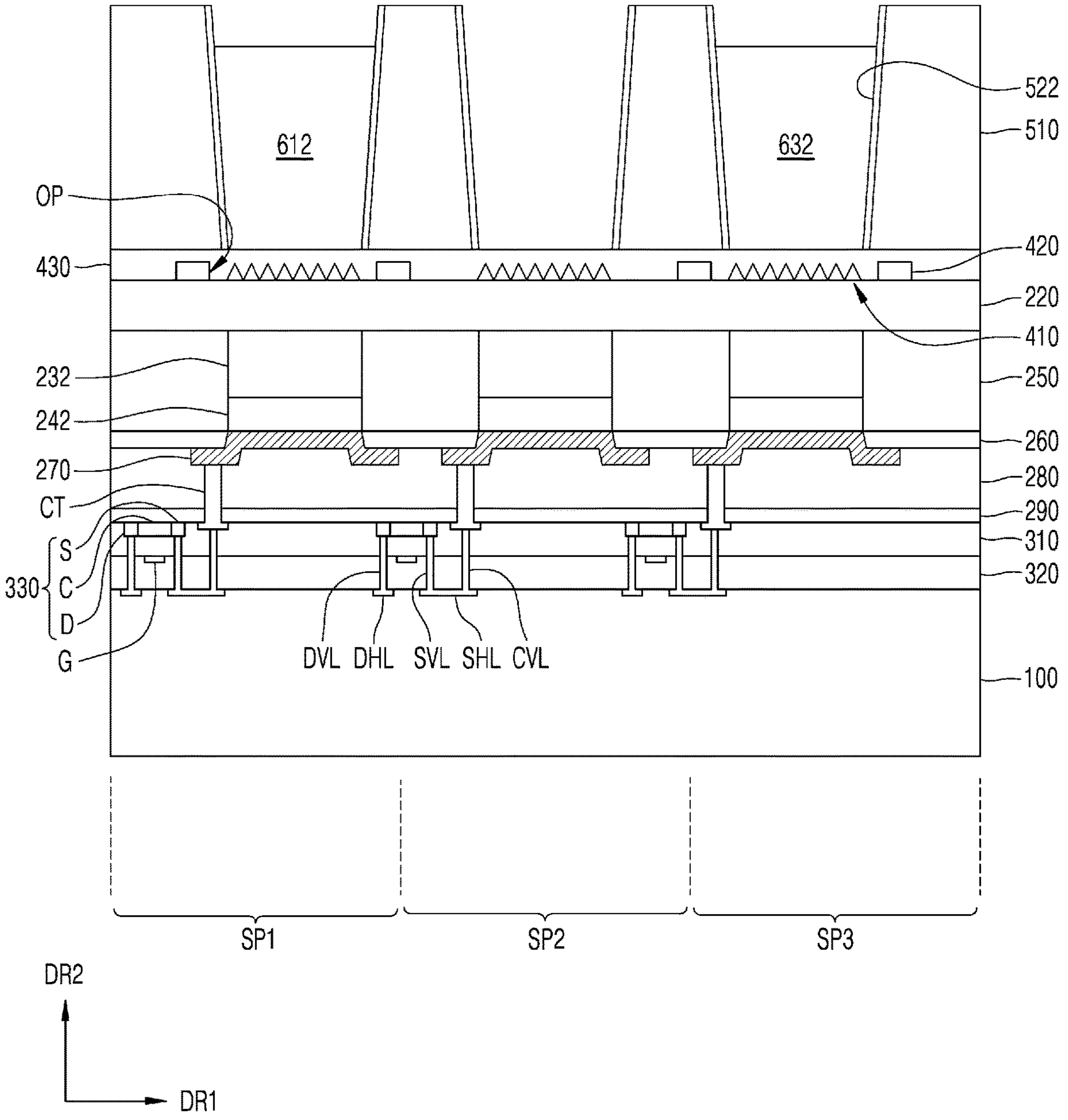
FIGS. 25 and 26 are cross-sectional views for describing a method of manufacturing a display device according to example embodiments.
Figure 26:
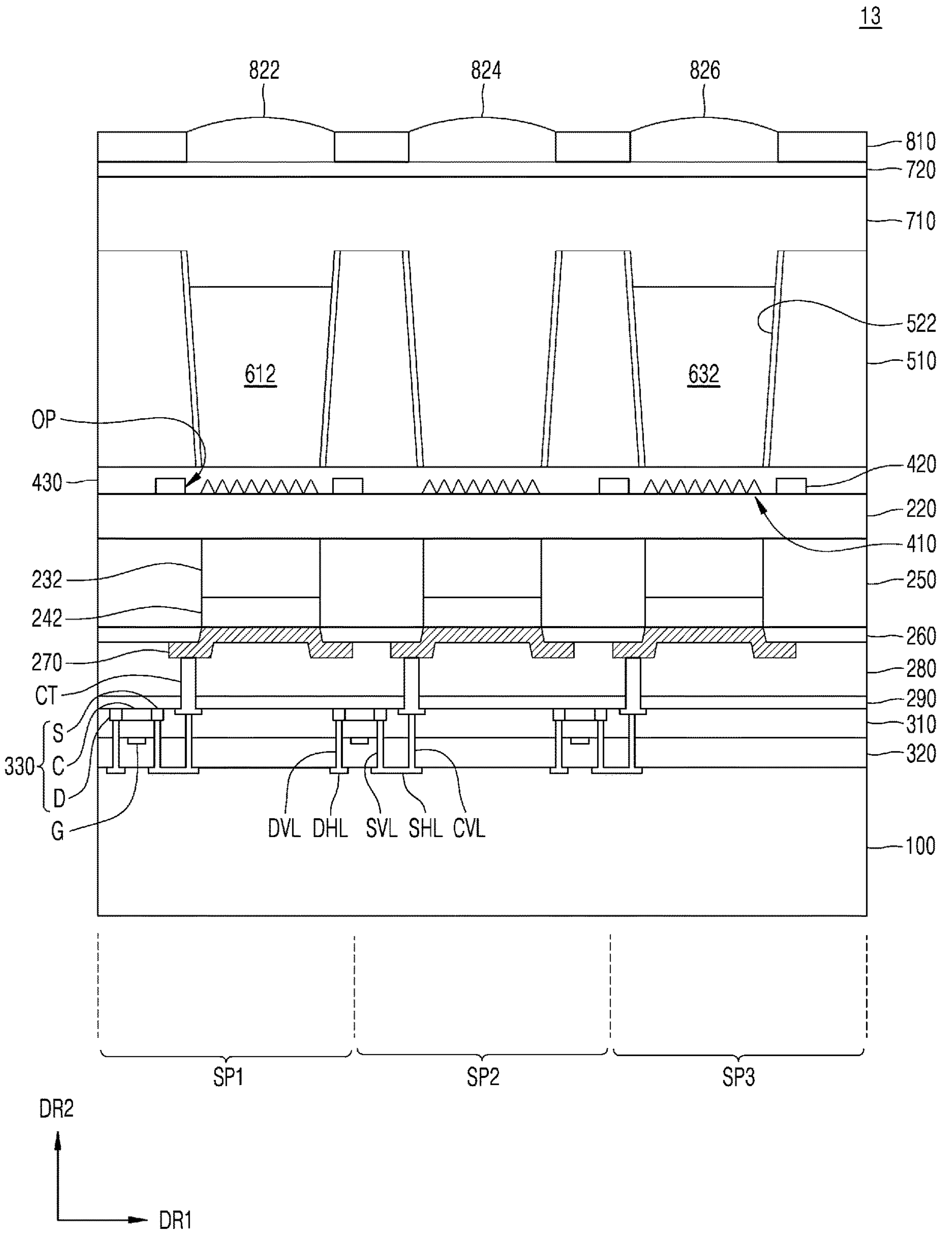

FIG. 24 is a planar view for describing a method of manufacturing a display device 13 according to example embodiments. FIGS. 25 and 26 are cross-sectional views for describing a method of manufacturing the display device 13 according to example embodiments. For conciseness, substantially the same descriptions as provided above with reference to FIGS. 3 to 20 may not be provided below.

Referring to FIG. 24, the display device 13 may not include the preliminary common electrode (420 in FIGS. 10 and 11) and the second pad (P2 in FIG. 11) in the second sub pixel area SP2 described with reference to FIGS. 10 and 11. Therefore, during a manufacturing process of the display device 13, the active pattern 232 in the second sub pixel area SP2 may not generate the second light.

Referring to FIG. 25, the first color adjustment pattern 612 and the third color adjustment pattern 632 may be formed. Since the active pattern 232 in the second sub pixel area SP2 does not generate the second light L2, the process of forming the second adjustment pattern may not be performed.

Referring to FIG. 26, the fourth insulating layer 710 may be formed on the light absorbing partition walls 510, the reflection patterns 522, the first color adjustment pattern 612, and the third color adjustment pattern 632. Unlike the fourth insulating layer described with reference to FIG. 20, the fourth insulating layer 710 may extend to an area between the light absorbing partition walls 510 in the second sub pixel area SP2. The fourth insulating layer 710 may fill an area between the light absorbing partition walls 510 in the second sub pixel area SP2. Accordingly, light emitted from the active pattern 232 in the second sub pixel area SP2 may pass through the fourth insulating layer 710 to reach the second color filter 824 without passing through the second color adjustment pattern (622 in FIG. 17) described with reference to FIG. 17.

The disclosure may provide a manufacturing method of the display device 13 by which the yield may be improved, and provide the display device 13 with improved durability.

FIGS. 27 to 35 are cross-sectional views for describing a method of manufacturing a display device 14 according to example embodiments. For conciseness, substantially the same descriptions as provided above with reference to FIGS. 3 to 20 may not be provided below.

Figure 27:
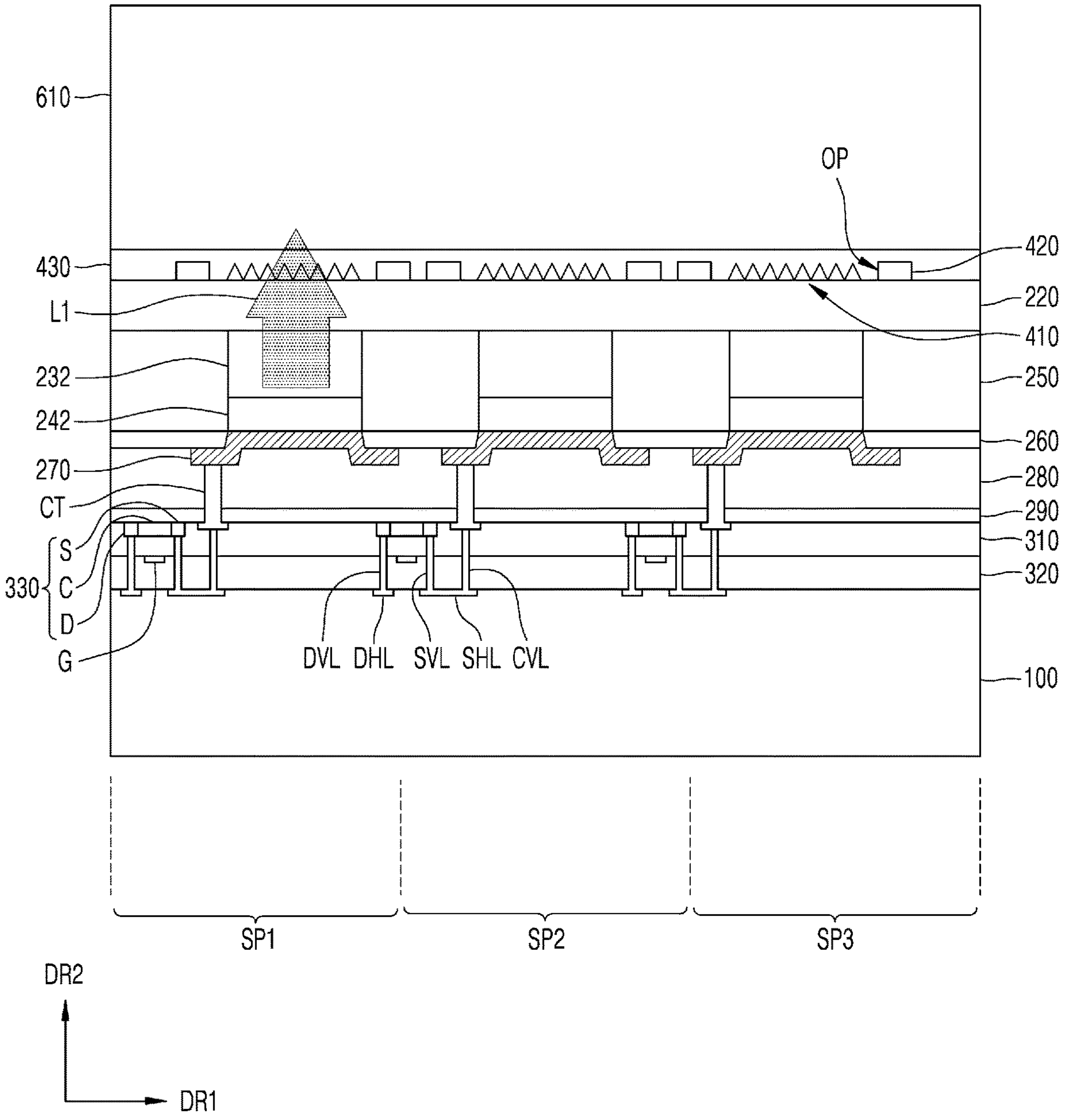
FIGS. 27 to 35 are cross-sectional views for describing a method of manufacturing a display device according to example embodiments.

Referring to FIG. 27, the display device 14 may not include the light absorbing partition walls (510 in FIG. 12) described with reference to FIG. 12.

The first color adjustment material layer 610 may be formed on the planarization layer 430. The forming of the first color adjustment material layer 610 may include, for example, performing a CVD process, a PVD process, or an ALD process.

The first light L1 may be radiated to the first color adjustment material layer 610. Accordingly, a portion of the first color adjustment material layer 610 may be cured. Generating the first light L1 from the active pattern 232 in the first sub pixel area SP1 may be substantially the same as described with reference to FIG. 14.

Figure 28:
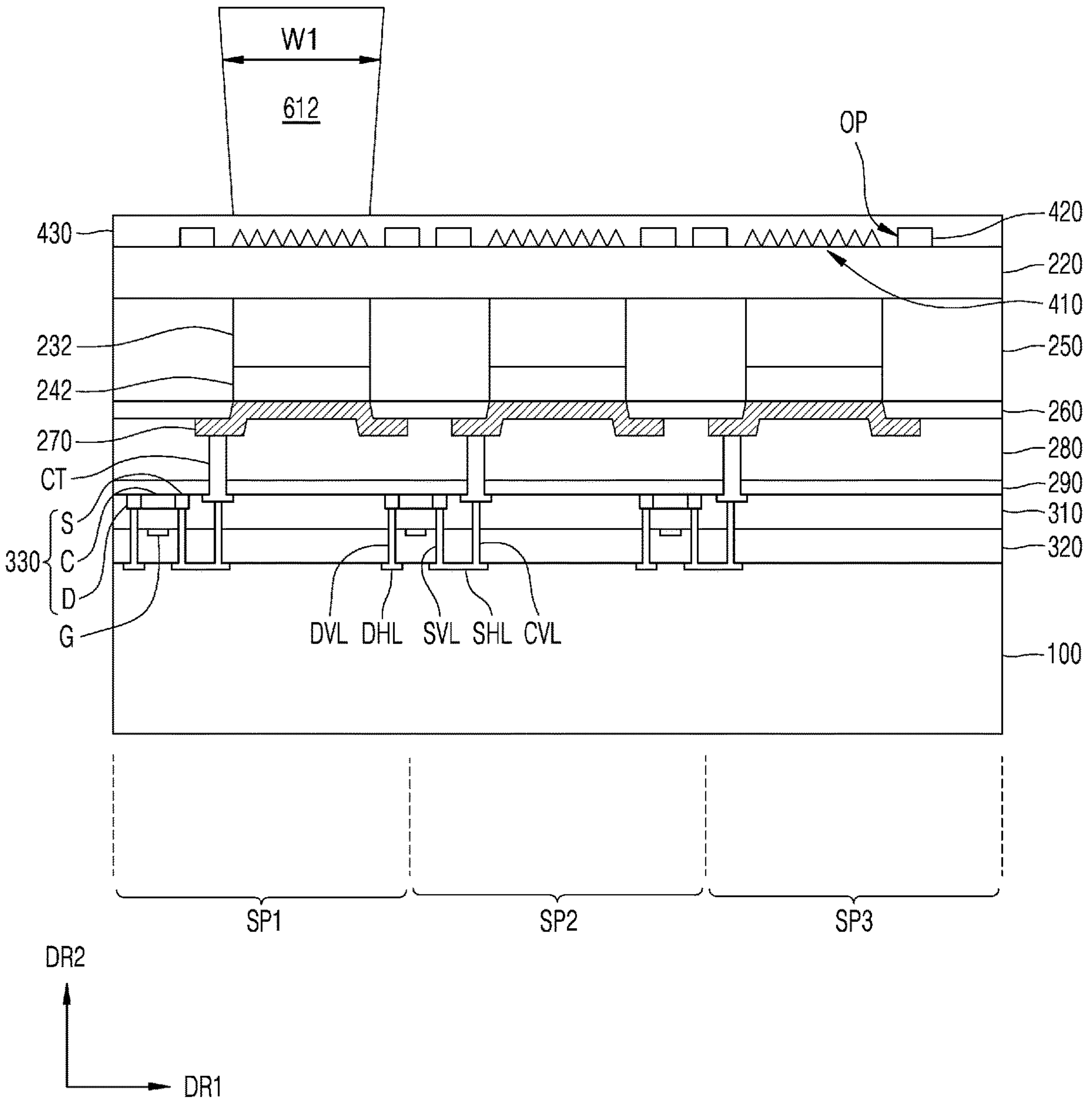

Referring to FIG. 28, the first color adjustment pattern 612 may be formed. The forming of the first color adjustment pattern 612 may include removing another portion, which is not cured, of the first color adjustment material layer 610. A width W1 of the first color adjustment pattern 612 may increase in the second direction DR2. The width W1 of the first color adjustment pattern 612 may be a size of the first color adjustment pattern 612 along the first direction DR1.

Figure 29:
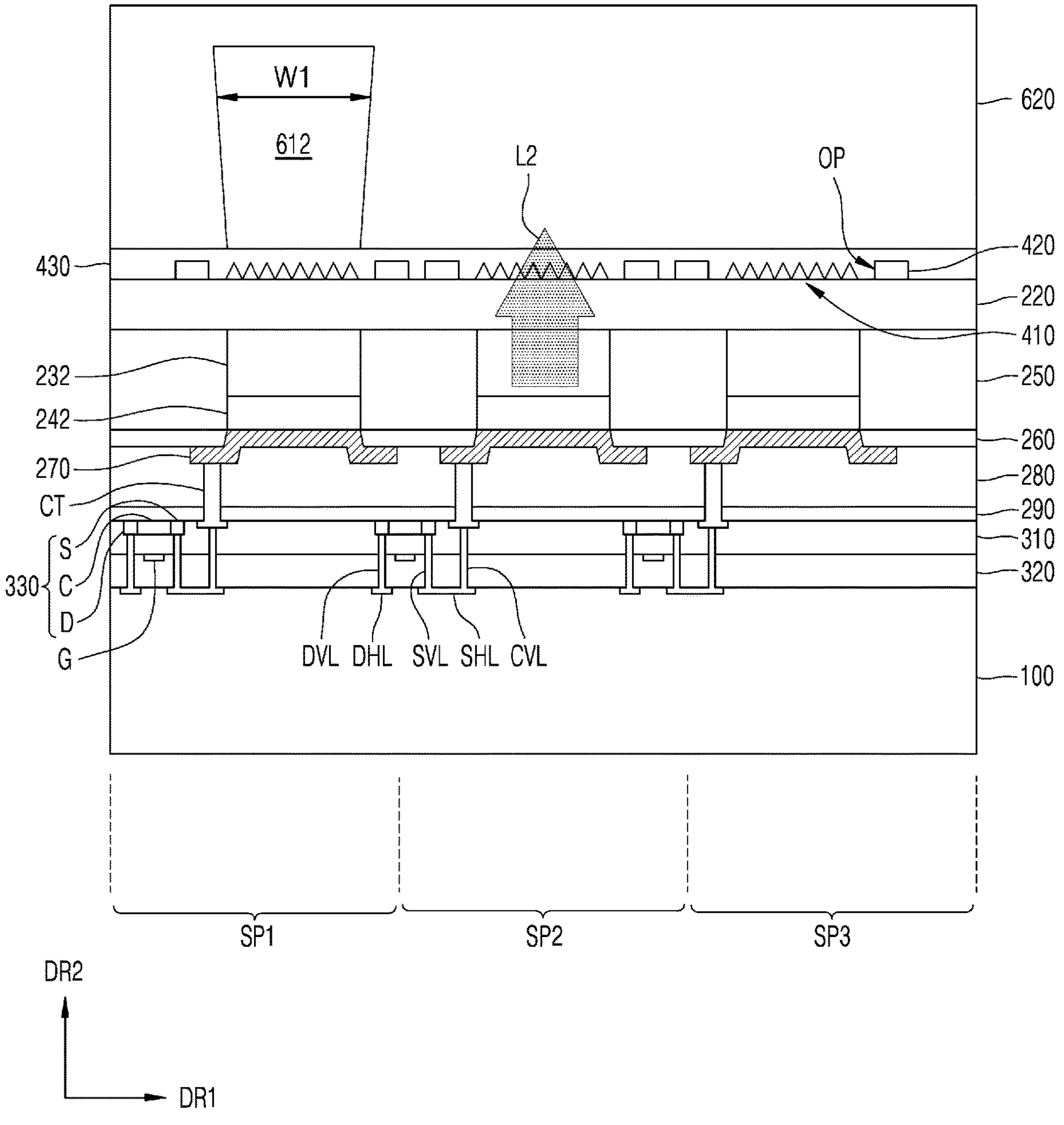

Referring to FIG. 29, the second color adjustment material layer 620 may be formed on the planarization layer 430 and the first color adjustment pattern 612. The forming of the second color adjustment material layer 620 may include, for example, performing a CVD process, a PVD process, or an ALD process.

The second light L2 may be radiated to the second color adjustment material layer 620. Accordingly, a portion of the second color adjustment material layer 620 may be cured. Generating the second light L2 from the active pattern 232 in the second sub pixel area SP2 may be substantially the same as described with reference to FIG. 16.

Figure 30:
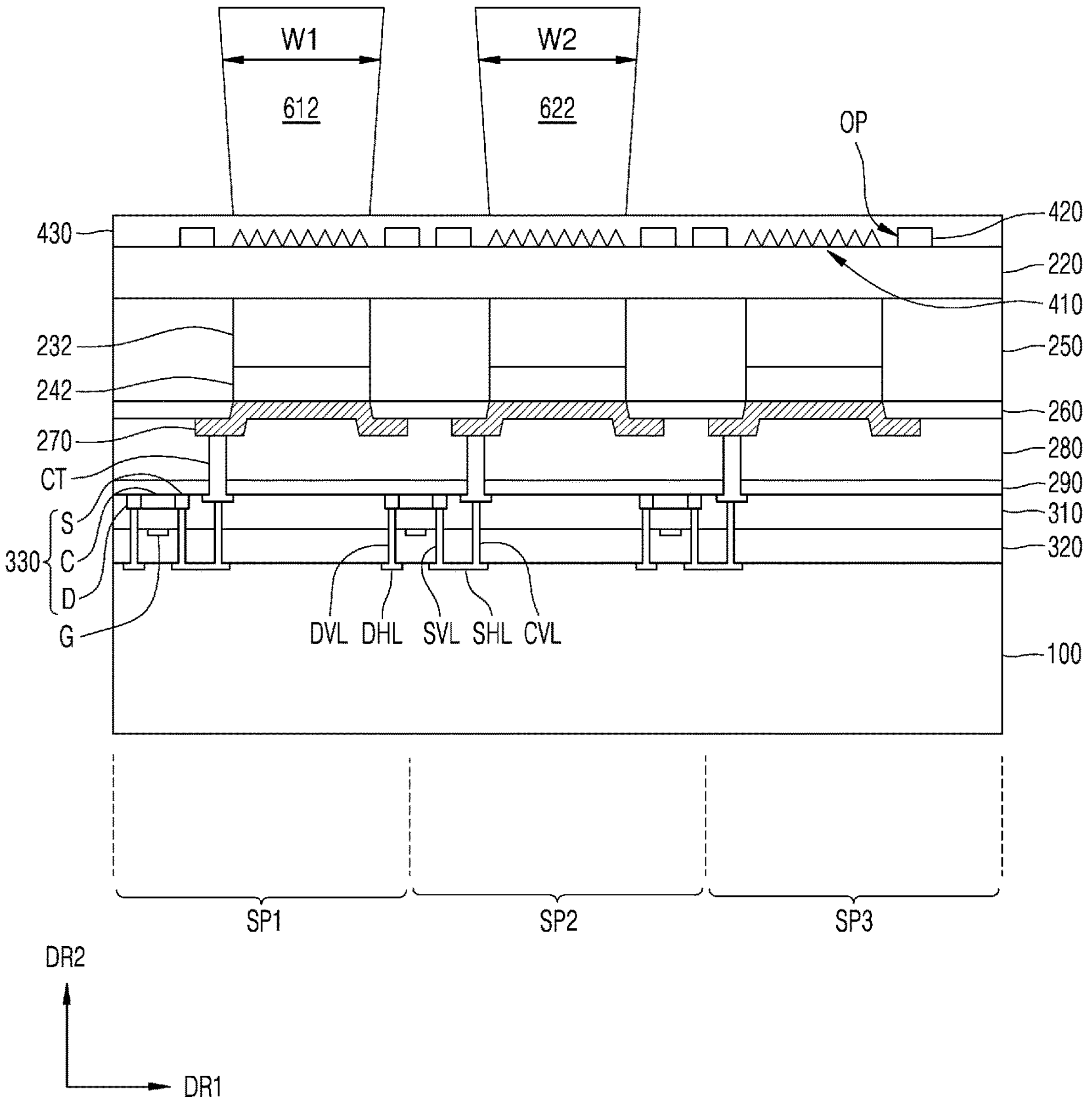

Referring to FIG. 30, the second color adjustment pattern 622 may be formed. The forming of the second color adjustment pattern 622 may include removing another portion, which is not cured, of the second color adjustment material layer 620. A width W2 of the second color adjustment pattern 622 may increase in the second direction DR2. The width W2 of the second color adjustment pattern 622 may be a size of the second color adjustment pattern 622 along the first direction DR1.

Figure 31:
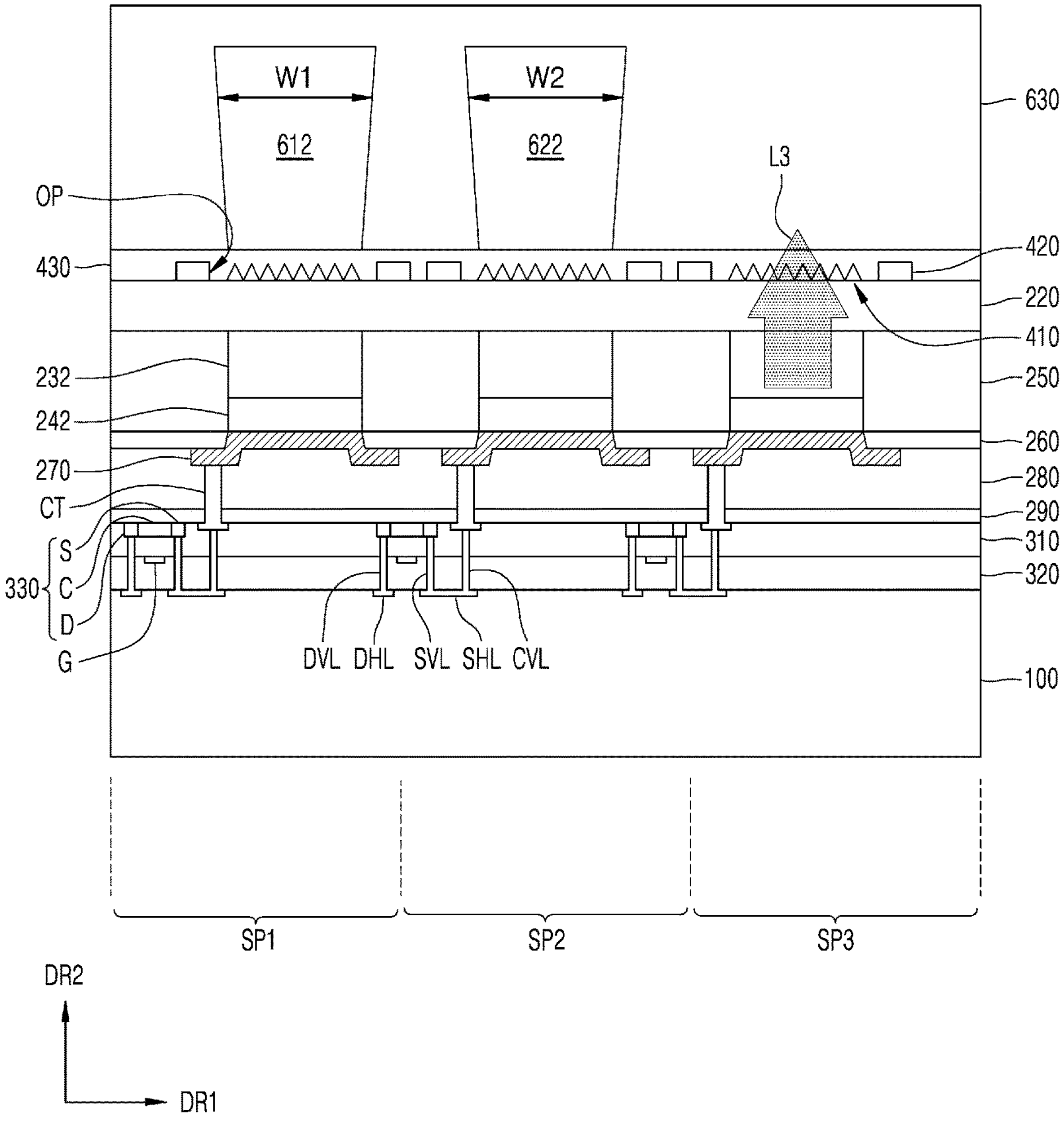

Referring to FIG. 31, the third color adjustment material layer 630 may be formed on the planarization layer 430, the first color adjustment pattern 612, and the second color adjustment pattern 622. The forming of the third color adjustment material layer 630 may include, for example, performing a CVD process, a PVD process, or an ALD process.

The third light L3 may be radiated to the third color adjustment material layer 630. Accordingly, a portion of the third color adjustment material layer 630 may be cured. Generating the third light L3 from the active pattern 232 in the third sub pixel area SP3 may be substantially the same as described with reference to FIG. 18.

Figure 32:
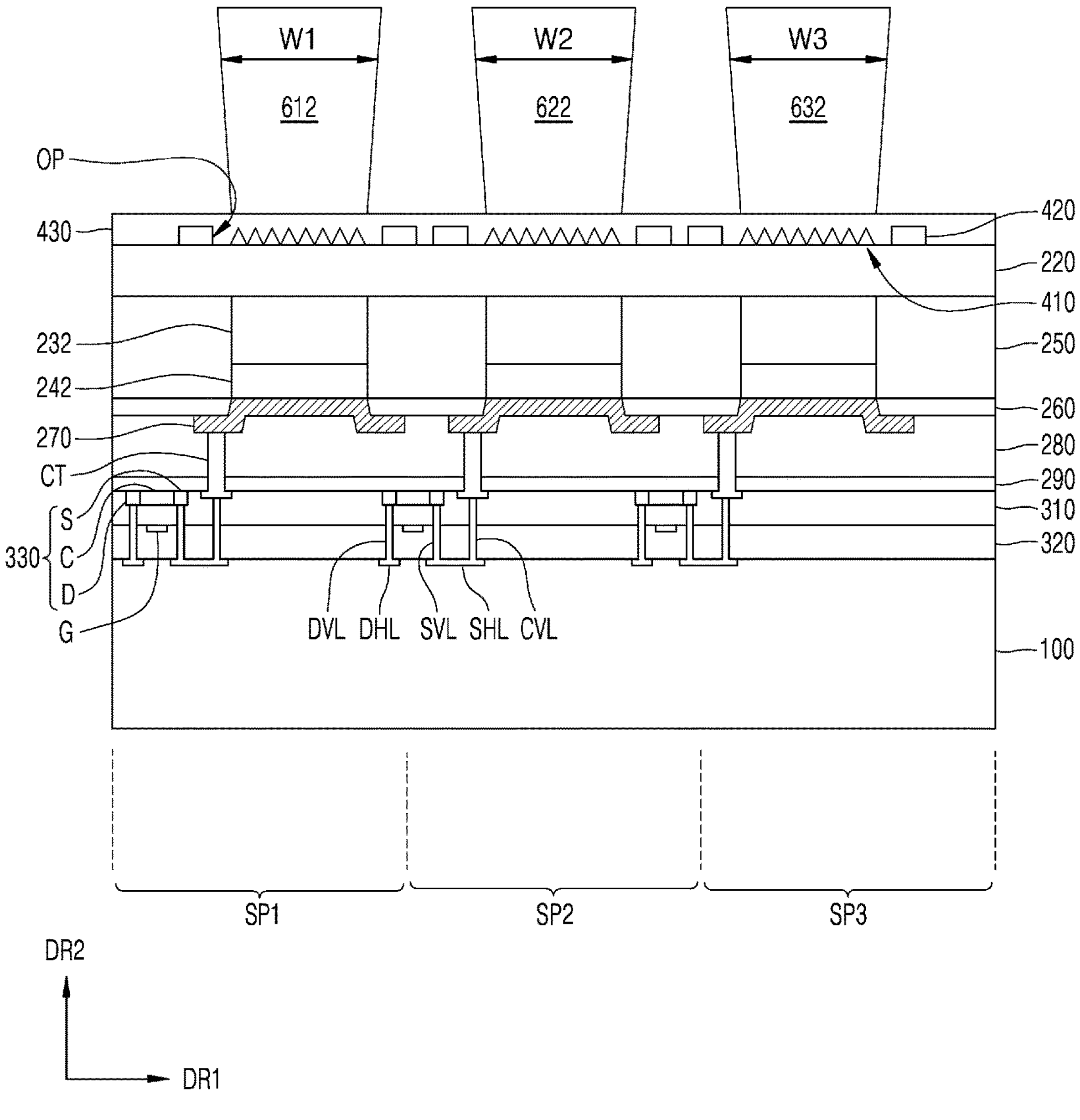

Referring to FIG. 32, the third color adjustment pattern 632 may be formed. The forming of the third color adjustment pattern 632 may include removing another portion, which is not cured, of the third color adjustment material layer 630. A width W3 of the third color adjustment pattern 632 may increase in the second direction DR2. The width W3 of the third color adjustment pattern 632 may be a size of the third color adjustment pattern 632 along the first direction DR1.

Figure 33:
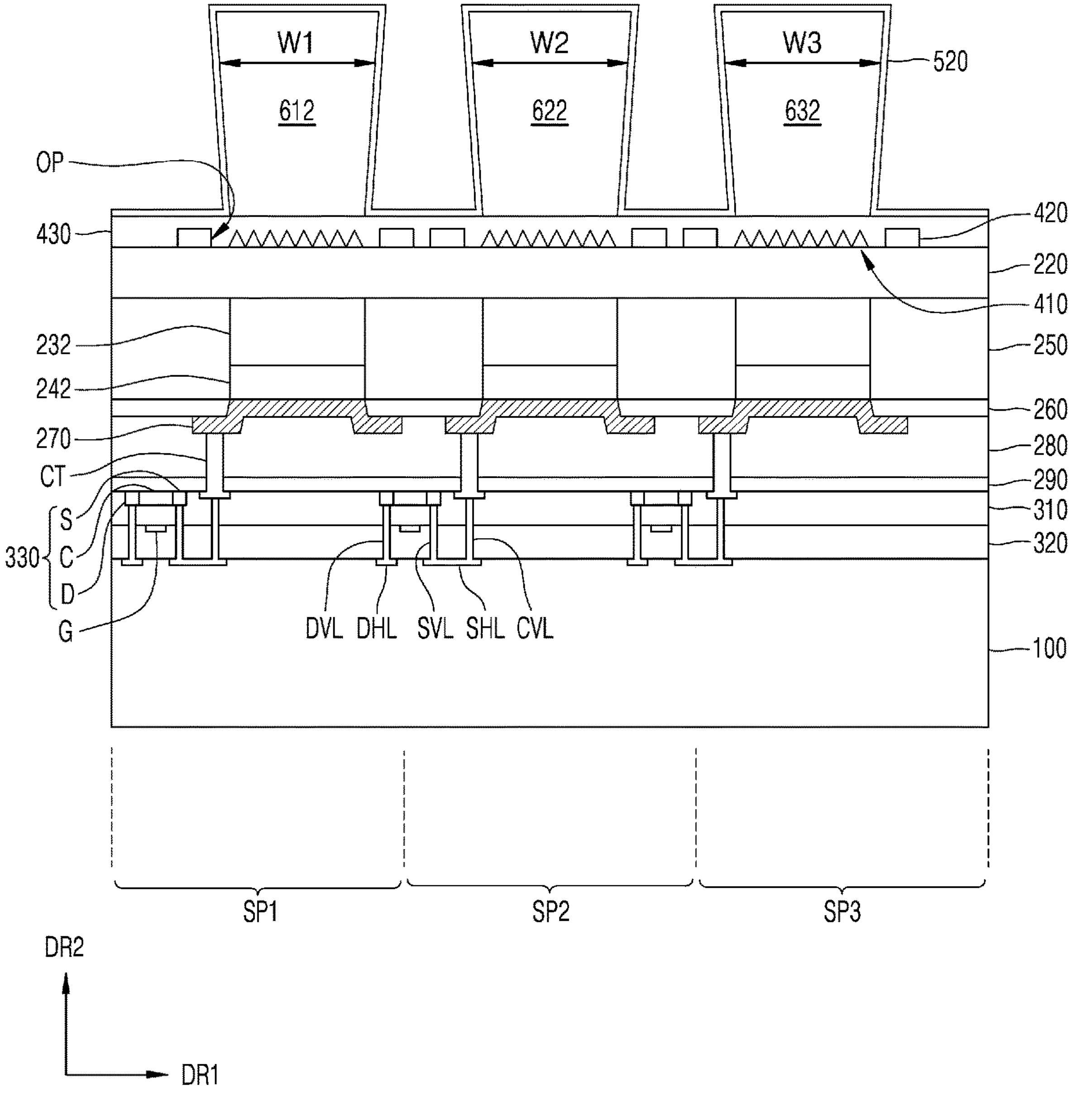

Referring to FIG. 33, the reflective film 520 may be formed on the planarization layer 430, the first color adjustment pattern 612, the second color adjustment pattern 622, and the third color adjustment pattern 632. The forming of the reflective film 520 may include, for example, performing a CVD process, a PVD process, or an ALD process. For example, the reflective film 520 may include at least one of silver (Ag), aluminum (Al), indium (In), titanium (Ti), nickel (Ni), copper (Cu), chromium (Cr), gold (Au), palladium (Pd), tungsten (W), or platinum (Pt). The reflective film 520 may conformably cover the planarization layer 430, the first color adjustment pattern 612, the second color adjustment pattern 622, and the third color adjustment pattern 632.

Figure 34:
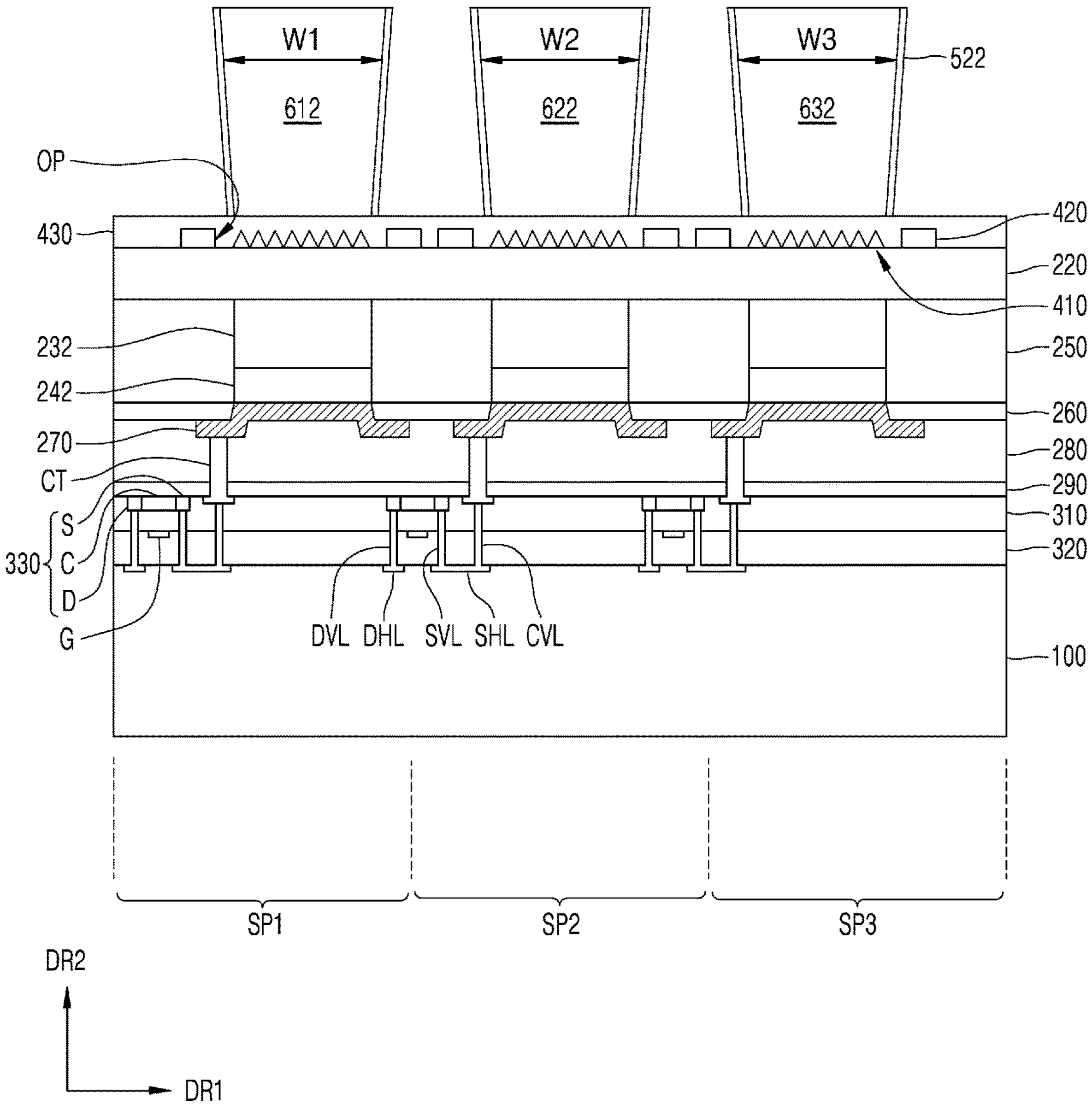

Referring to FIG. 34, the reflection patterns 522 may be formed on side surfaces of the first color adjustment pattern 612, the second color adjustment pattern 622, and the third color adjustment pattern 632. The forming of the reflection patterns 522 may include exposing upper surfaces of the first color adjustment pattern 612, the second color adjustment pattern 622, the third color adjustment pattern 632, and the planarization layer 430 by performing an anisotropic etching process on the reflective film 520.

Figure 35:
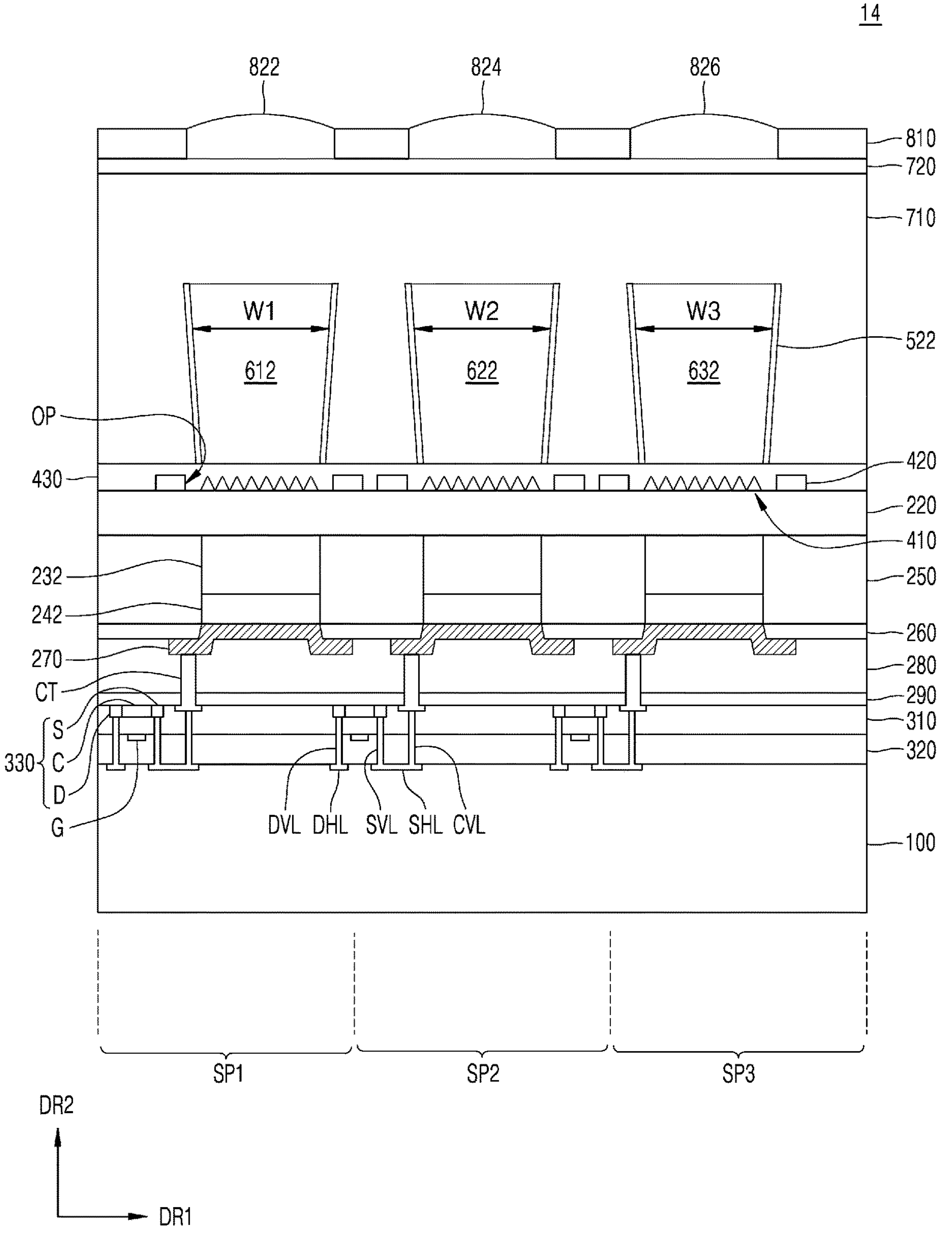

Referring to FIG. 35, the fourth insulating layer 710 may be formed on the planarization layer 430, the first color adjustment pattern 612, the second color adjustment pattern 622, the third color adjustment pattern 632, and the reflection patterns 522. The fourth insulating layer 710 may fill areas between the reflection patterns 522 to form as insulating partition wall having a light-transmitting property.

The encapsulation layer 720, the black matrix patterns 810, the first color filter 822, the second color filter 824, and the third color filter 826 may be formed on the fourth insulating layer 710. Accordingly, the display device 14 may be formed.

The disclosure may provide a manufacturing method of the display device 14 by which the yield may be improved, and provide the display device 14 with improved durability.

Figure 36:
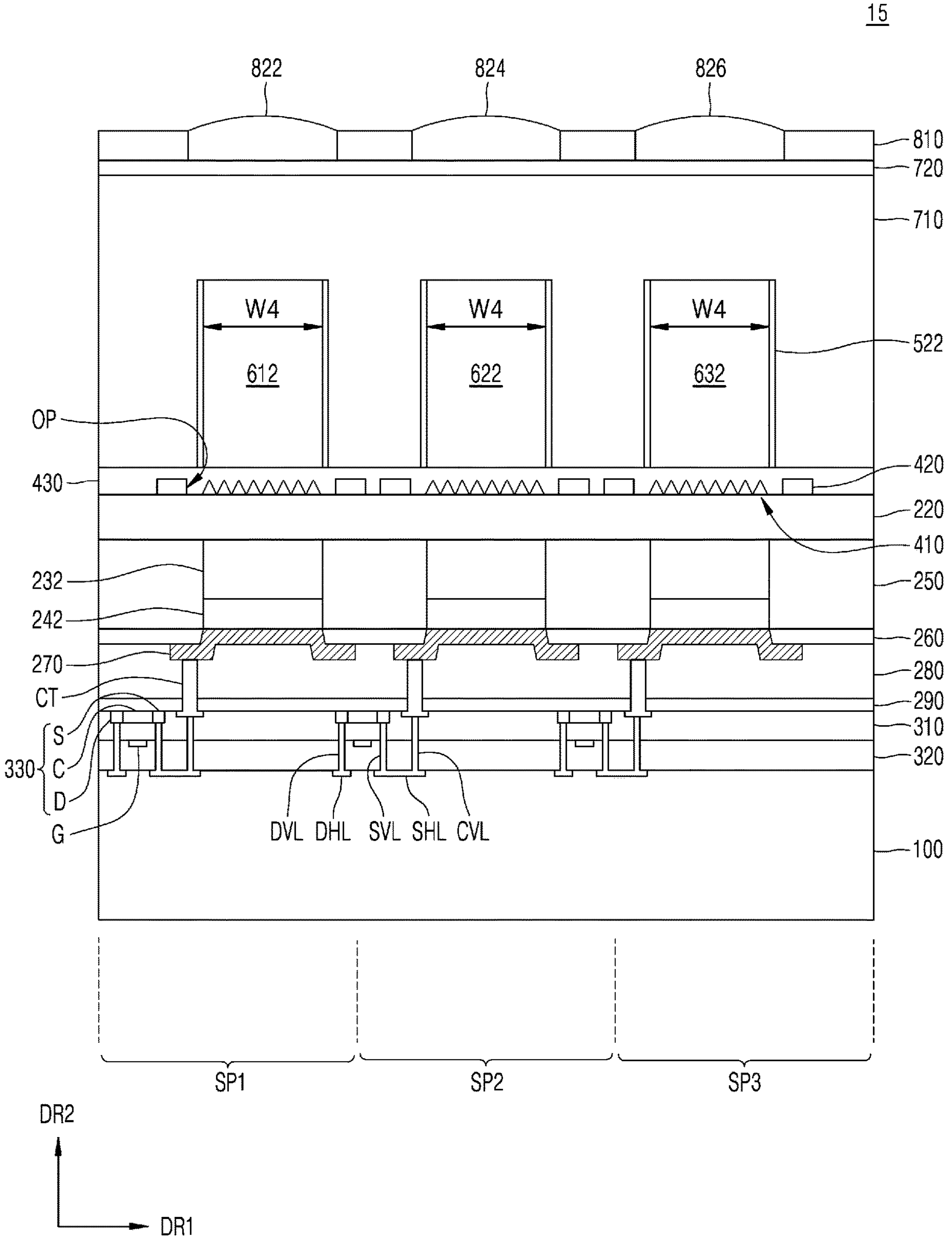
FIG. 36 is a cross-sectional view for describing a method of manufacturing a display device according to example embodiments.

FIG. 36 is a cross-sectional view for describing a method of manufacturing a display device 15 according to example embodiments. For conciseness, substantially the same descriptions as provided above with reference to FIGS. 27 to 35 may not be provided below.

Referring to FIG. 36, each of the first color adjustment pattern 612, the second color adjustment pattern 622, and the third color adjustment pattern 632 may have a constant width W4 unlike the first to third color adjustment patterns described with reference to FIGS. 27 to 35. In other words, side surfaces of the first color adjustment pattern 612, the second color adjustment pattern 622, and the third color adjustment pattern 632 may extend along the second direction DR2 without the width W4 of the first color adjustment pattern 612, the second color adjustment pattern 622, and the third color adjustment pattern 632 being increased.

The disclosure may provide a manufacturing method of the display device 15 by which the yield may be improved, and provide the display device 15 with improved durability.

One or more example embodiments of the disclosure may provide a display device with improved durability.

One or more example embodiments of the disclosure may provide a display device manufacturing method that provides improved yield.

However, it should be understood that the example embodiments described herein should be considered in a descriptive sense only and not for purposes of limitation. Descriptions of features or aspects within each of the example embodiments should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of manufacturing a display device, the method comprising:
- forming a first light-emitting area and a second light-emitting area on a support substrate;
- forming a first color adjustment pattern on the first light-emitting area by emitting first light from the first light-emitting area,
- wherein the forming of the first light-emitting area comprises:
  - providing a first semiconductor layer;
  - providing a second semiconductor layer on the first semiconductor layer;
  - providing a first active layer between the first semiconductor layer and the second semiconductor layer;
  - providing a first contact electrically connecting the support substrate and the first semiconductor layer; and
  - providing a first preliminary common electrode electrically connected to the second semiconductor layer,
- wherein the forming of the second light-emitting area comprises: providing a third semiconductor layer; providing a fourth semiconductor layer on the third semiconductor layer; providing a second active layer between the third semiconductor layer and the fourth semiconductor layer; providing a second contact electrically connecting the support substrate and the third semiconductor layer; and providing a second preliminary common electrode electrically connected to the fourth semiconductor layer,
- the second semiconductor layer and the fourth semiconductor layer are different parts of a single semiconductor layer,
- when the first color adjustment pattern is formed, a first voltage is applied to the first preliminary common electrode, a second voltage is applied to the second preliminary common electrode, and a ground voltage is applied to the support substrate,
- a magnitude of the first voltage is larger than a magnitude of the second voltage, and
- when the display device is driven, a common voltage is applied to the first preliminary common electrode and the second preliminary common electrode.

2. The method of claim 1, wherein the forming of the first light-emitting area on the support substrate comprises:
- sequentially forming the second semiconductor layer, the first active layer, and the first semiconductor layer on a growth substrate;
- forming the first contact on the first semiconductor layer;
- forming the support substrate on the first contact;
- removing the growth substrate; and
- forming the first preliminary common electrode on a surface of the second semiconductor layer exposed by removing the growth substrate.

3. The method of claim 2, wherein the support substrate is directly bonded to the first contact.

4. The method of claim 2, further comprising:
- forming a bonding layer between the support substrate and the first contact,
- wherein the support substrate and the first contact are bonded to each other by the bonding layer.

5. The method of claim 1, wherein the forming of the first color adjustment pattern comprises:
- providing a first color adjustment material layer on the first active layer;
- curing a portion of the first color adjustment material layer by emitting the first light to the first color adjustment material layer; and
- removing an uncured portion of the first color adjustment material layer.

6. The method of claim 1, further comprising:
- providing a first light extraction pattern on an upper surface of the second semiconductor layer.

7. The method of claim 1,
- wherein the forming of the first light-emitting area further comprises:
- forming a first preliminary driving transistor,
- wherein a source area of the first preliminary driving transistor is electrically connected to the first contact.

8. The method of claim 1, further comprising:

forming a second color adjustment pattern on the second light-emitting area by emitting a second light from the second light-emitting area, wherein the first light-emitting area and the second light-emitting area are spaced apart from each other along a first direction parallel with an upper surface of the support substrate.

9. The method of claim 8, further comprising:

forming an isolation area between the first light-emitting area and the second light-emitting area, wherein the isolation area is formed by an ion injection process.

10. The method of claim 8, wherein the forming of the second color adjustment pattern comprises:

providing a second color adjustment material layer on the second light-emitting area;

curing a portion of the second color adjustment material layer by irradiating the second light to the second color adjustment material layer; and removing an uncured portion of the second color adjustment material layer.

11. The method of claim 8, further comprising forming a light-absorbing partition wall between the first color adjustment pattern and the second color adjustment pattern.

12. The method of claim 11, further comprising:

forming a first reflective film between the light-absorbing partition wall and the first color adjustment pattern; and forming a second reflective film between the light-absorbing partition wall and the second color adjustment pattern.

13. The method of claim 12, further comprising forming a third reflective film on an upper surface of the light-absorbing partition wall.

14. The method of claim 8, further comprising:

forming an insulating partition wall between the first color adjustment pattern and the second color adjustment pattern;

forming a first reflective film between the insulating partition wall and the first color adjustment pattern; and forming a second reflective film between the insulating partition wall and the second color adjustment pattern, wherein the insulating partition wall has a light-transmitting property.

15. The method of claim 14, wherein a width of the insulating partition wall decreases in a second direction perpendicular to the upper surface of the support substrate, and wherein the width of the insulating partition wall is a size of the insulating partition wall along the first direction.

16. The method of claim 14, wherein a width of the insulating partition wall is constant, wherein the width of the insulating partition wall is a size of the insulating partition wall along the first direction.

17. The method of claim 8, further comprising:

forming a first color filter on the first color adjustment pattern; and forming a second color filter on the second color adjustment pattern, wherein the first color filter allows a first color light to pass through and the second color filter allows a second color light to pass through, the first color light being different from the second color light.

18. The method of claim 1, wherein the emitting of the second light comprises:

applying a third voltage to the first preliminary common electrode;

applying a fourth voltage that is different from the third voltage to the second preliminary common electrode; and applying the ground voltage to the support substrate, wherein a magnitude of the fourth voltage is larger than a magnitude of the third voltage.

19. A method of manufacturing a display device, the method comprising:

forming a first semiconductor layer on a growth substrate;

forming, on the first semiconductor layer, active patterns arranged along a first direction that is parallel to an upper surface of the first semiconductor layer;

forming a second semiconductor layer on the active patterns, respectively;

forming one or more contacts on the second semiconductor layer, respectively;

bonding a support substrate onto the one or more contacts;

removing the growth substrate;

forming preliminary common electrodes respectively corresponding to one or more of the active patterns on a side of the active patterns opposite to the second semiconductor layer; and forming color adjustment patterns respectively on the active patterns by emitting light from the active patterns, wherein the color adjustment patterns comprises a first color adjustment pattern and a second adjustment pattern, and the preliminary common electrodes comprises a first preliminary common electrode and a second preliminary common electrode, when the first color adjustment pattern is formed, a first voltage is applied to the first preliminary common electrode, a second voltage is applied to the second preliminary common electrode, and a ground voltage is applied to the support substrate, a magnitude of the first voltage is larger than a magnitude of the second voltage, and when the display device is driven, a common voltage is applied to the first preliminary common electrode and the second preliminary common electrode.

20. The method of claim 19, further comprising reducing a thickness of the first semiconductor layer by performing an etching process on the first semiconductor layer exposed by removing the growth substrate.

21. The method of claim 19, further comprising patterning the first semiconductor layer to form light extraction patterns respectively on the active patterns.

22. The method of claim 19, further comprising forming, in the preliminary common electrodes, openings that expose the first semiconductor layer, respectively.

23. The method of claim 19, wherein the removing of the growth substrate comprises performing a polishing process and a dry etching process on the growth substrate, wherein the growth substrate comprises silicon (Si).

24. The method of claim 19, wherein the removing of the growth substrate comprises performing a lift-off process on the growth substrate using laser, wherein the growth substrate comprises sapphire.

25. The method of claim 19, wherein, among the color adjustment patterns, color adjustment patterns which emit light having different colors are formed at different times.

26. A method of manufacturing a display device, the method comprising:

forming, on a substrate, a first contact, a second contact, and a third contact, which are arranged along a first direction that is parallel to an upper surface of the substrate;

forming a first light-emitting pattern on the first contact, a second light-emitting pattern on the second contact, and a third light-emitting pattern on the third contact;

forming a first preliminary common electrode on the first light-emitting pattern and a second preliminary common electrode on the second light-emitting pattern;

forming a first color adjustment pattern on the first light-emitting pattern by emitting a first light from the first light-emitting pattern; and forming a second color adjustment pattern on the second light-emitting pattern by emitting a second light from the second light-emitting pattern, wherein each of the first light-emitting pattern, the second light-emitting pattern, and the third light-emitting pattern comprises a first semiconductor layer, a second semiconductor layer, and an active layer provided between the first and second semiconductor layers, wherein the forming of the second light-emitting pattern comprises: providing a third semiconductor layer; providing a fourth semiconductor layer on the third semiconductor layer; providing a second active layer between the third semiconductor layer and the fourth semiconductor layer; providing a second contact electrically connecting the substrate and the third semiconductor layer; and providing a second preliminary common electrode electrically connected to the fourth semiconductor layer, the second semiconductor layer and the fourth semiconductor layer are different parts of a single semiconductor layer, when the first color adjustment pattern is formed, a first voltage is applied to the first preliminary common electrode, a second voltage is applied to the second preliminary common electrode, and a ground voltage is applied to the substrate, a magnitude of the first voltage is larger than a magnitude of the second voltage, and when the display device is driven, a common voltage is applied to the first preliminary common electrode and the second preliminary common electrode.

27. The method of claim 26, wherein the forming of the first color adjustment pattern and the forming of the second color adjustment pattern are performed at different times.

28. The method of claim 26, further comprising:

forming an insulating pattern on the third light-emitting pattern; and forming reflective films respectively between the insulating pattern and the first color adjustment pattern and between the insulating pattern and the second color adjustment pattern, wherein the first color adjustment pattern, the second color adjustment pattern, and the insulating pattern are arranged in the first direction.

29. The method of claim 28, further comprising:

forming an insulating film on the first color adjustment pattern, the second color adjustment pattern, the insulating pattern, and the reflective films, wherein the insulating film and the insulating pattern form a single structure.

30. The method of claim 26, further comprising:

forming a dummy preliminary common electrode on the third light-emitting pattern, wherein a voltage is not applied to the dummy preliminary common electrode.

31. The method of claim 26, further comprising:

forming a third preliminary common electrode on the third light-emitting pattern; and forming a third color adjustment pattern on the third light-emitting pattern by emitting a third light from the third light-emitting pattern.

32. The method of claim 31, further comprising:

forming a conductive pad on the third preliminary common electrode; and forming a via electrically connecting the conductive pad and the third preliminary common electrode.

* * * * *